United States Patent
Freebern et al.

(10) Patent No.: US 7,433,261 B2
(45) Date of Patent: Oct. 7, 2008

(54) DIRECTED AUTO-REFRESH FOR A DYNAMIC RANDOM ACCESS MEMORY

(75) Inventors: Margaret Clark Freebern, Richmond, VT (US); Kazimierz Szczypinski, München (DE)

(73) Assignee: Infineon Technologies AG, Munich (DE)

( * ) Notice: Subject to any disclaimer, the term of this patent is extended or adjusted under 35 U.S.C. 154(b) by 232 days.

(21) Appl. No.: 11/251,683

(22) Filed: Oct. 17, 2005

(65) Prior Publication Data

US 2007/0086266 A1 Apr. 19, 2007

(51) Int. Cl.
*G11C 8/06* (2006.01)
*G11C 8/12* (2006.01)
*G11C 8/18* (2006.01)
*G11C 11/406* (2006.01)
*G11C 11/4076* (2006.01)
*G11C 11/408* (2006.01)

(52) U.S. Cl. ............. 365/230.08; 365/222; 365/230.03; 365/189.04; 365/233.1

(58) Field of Classification Search ............ 365/230.03, 365/230.08, 233, 222, 189.04, 233.1
See application file for complete search history.

(56) References Cited

U.S. PATENT DOCUMENTS

| 5,463,590 | A | * | 10/1995 | Watanabe | ............. 365/230.03 |
| 5,796,669 | A | | 8/1998 | Araki et al. | |
| 5,999,472 | A | * | 12/1999 | Sakurai | ..................... 365/222 |
| 6,233,195 | B1 | * | 5/2001 | Yamazaki et al. | ...... 365/230.03 |
| 6,363,024 | B1 | | 3/2002 | Fibranz | |
| 6,570,803 | B2 | * | 5/2003 | Kyung | ..................... 365/222 |
| 6,771,553 | B2 | | 8/2004 | Cowles et al. | |
| 6,859,407 | B1 | | 2/2005 | Suh | |

FOREIGN PATENT DOCUMENTS

KR   10-2003-0001710      8/2003

OTHER PUBLICATIONS

"Corresponding Korean patent application Notice of Allowance issued on Apr. 15, 2008.".

* cited by examiner

*Primary Examiner*—J. H. Hur
(74) *Attorney, Agent, or Firm*—Dicke, Billig & Czaja, PLLC

(57) ABSTRACT

A memory includes a row address latch. The row address latch includes a first stage configured to latch a row address for a memory read or write operation, and a second stage configured to latch a row address for a memory bank auto-refresh. The row address latch provides the row address from the first stage in response to an activate command and provides the row address from the second stage in response to a directed auto-refresh command.

16 Claims, 17 Drawing Sheets

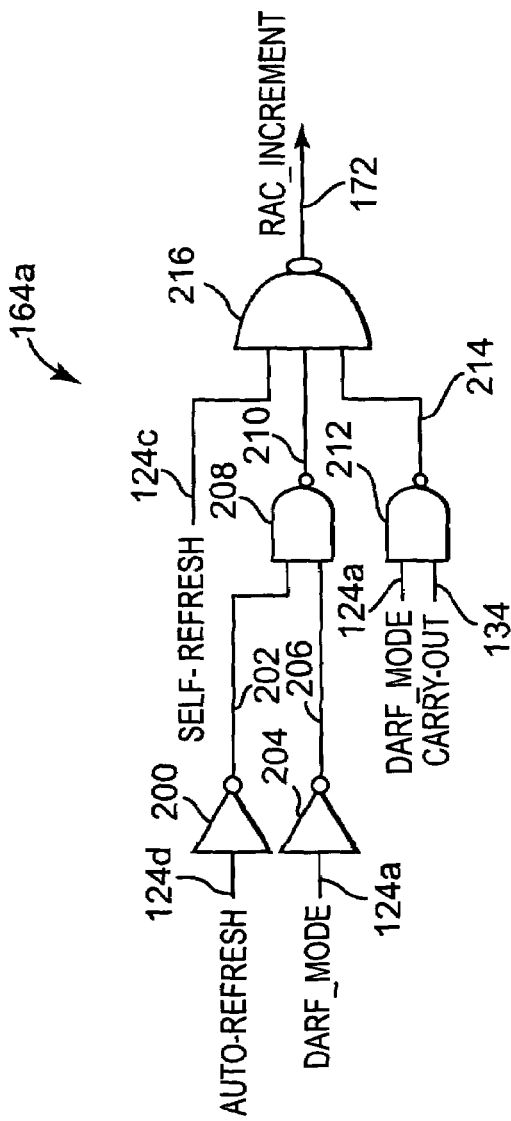
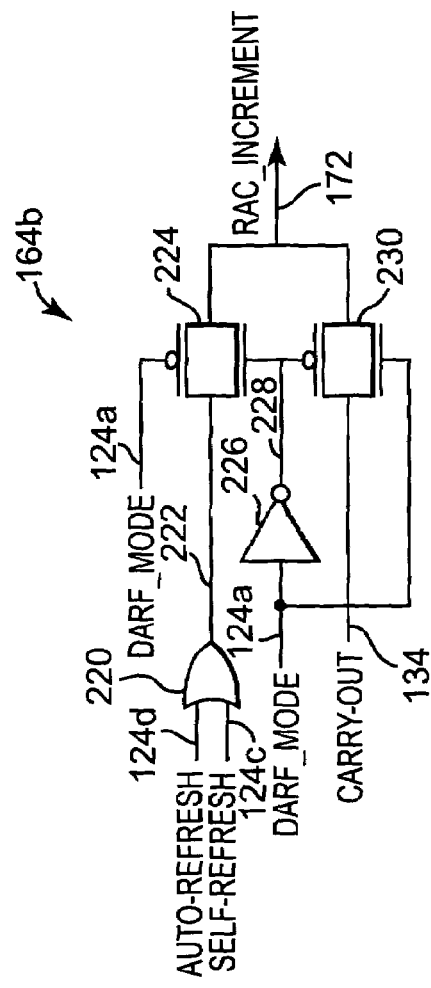
Fig. 5A
Fig. 5B

DIRECTED AUTO-REFRESH FOR A DYNAMIC RANDOM ACCESS MEMORY

CROSS-REFERENCE TO RELATED APPLICATIONS

This application is related to U.S. patent application Ser. No. 11/252,041, entitled "DIRECTED AUTO-REFRESH FOR A DYNAMIC RANDOM ACCESS MEMORY," filed Oct. 17, 2005, and U.S. patent application Ser. No. 11/251,678, entitled "DIRECTED AUTO-REFRESH FOR A DYNAMIC RANDOM ACCESS MEMORY," filed Oct. 17, 2005, which are incorporated herein by reference.

BACKGROUND

One type of memory is a dynamic random access memory (DRAM). DRAMs are a volatile memory in which the contents of the memory cells leak away over time. The memory cells are periodically refreshed to maintain their values. One mode for periodically refreshing the memory cells includes an auto-refresh or constant bit rate (CBR) refresh. Auto-refresh or CBR refresh is one method of refreshing DRAM memory cells. This method involves stopping normal read and write operations, precharging all memory banks, refreshing a group of memory cells in each bank, reactivating the memory banks, and then continuing with normal read and write operations. The memory cells are refreshed at a frequency such that every memory cell is refreshed within its retention time. The precharge and reactivation of the memory banks reduces the bandwidth of the DRAM because the precharge and reactivation of the memory banks inserts cycles where data is being neither read nor written and no memory cells are being refreshed.

Typical auto-refresh implementations use a DRAM controller to issue auto-refresh commands frequently enough that the entire memory is refreshed within the specified retention time. Because each command is issued separately, a user may schedule the auto-refreshes to occur when the DRAM is not being actively read or written, or whenever it is most bandwidth efficient to do so. These scheduling strategies may reduce the bandwidth penalty; however, they are still insufficient for some applications.

SUMMARY

One embodiment of the present invention provides a memory. The memory includes a row address latch. The row address latch includes a first stage configured to latch a row address for a memory read or write operation, and a second stage configured to latch a row address for a memory bank auto-refresh. The row address latch provides the row address from the first stage in response to an activate command and provides the row address from the second stage in response to a directed auto-refresh command.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 5A is a diagram illustrating one embodiment of row address counter increment logic.

FIG. 5B is a diagram illustrating another embodiment of row address counter increment logic.

DETAILED DESCRIPTION

Figure 1:
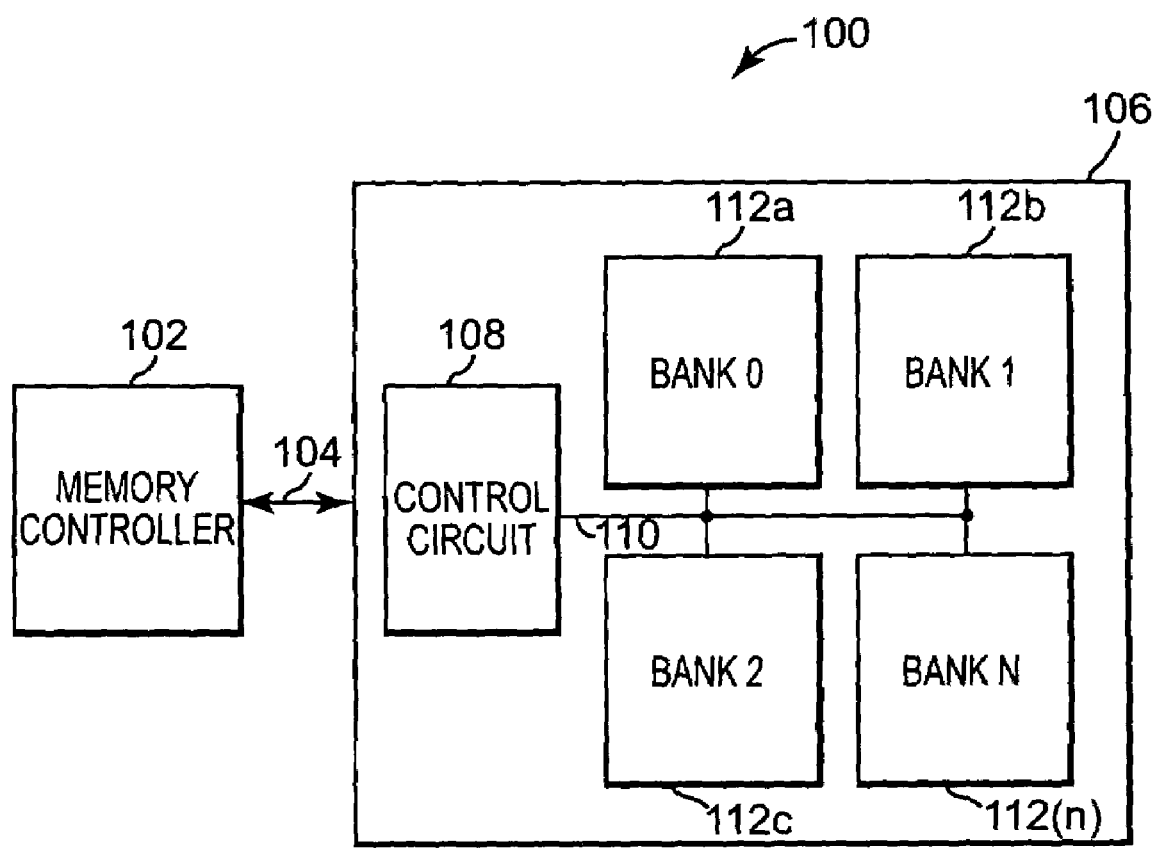
FIG. 1 is a block diagram illustrating one embodiment of a memory device.

FIG. 1 is a block diagram illustrating one embodiment of a memory device 100. In one embodiment, memory device 100 includes a dynamic random access memory (DRAM). Memory device 100 includes a memory controller 102 and a memory 106. Memory controller 102 is electrically coupled to memory 106 through communication path 104. Memory controller 102 controls the operation of memory 106. Memory 106 includes a control circuit 108 and a plurality of memory banks 112a-112(n), where "n" equals any suitable number of memory banks. In one embodiment "n" equals 3. Control circuit 108 is electrically coupled to memory banks 112a-112(n) through communication path 110.

Control circuit 108 is configured to implement a directed auto-refresh (DARF) mode for memory 106. The DARF mode implementation provides auto-refresh scheduling flexibility that reduces the bandwidth penalty of refreshing memory cells within memory banks 112a-112(n). A DARF command is an auto-refresh command that is issued when memory 106 is in DARF mode. One DARF command refreshes one memory bank 112a-112(n) at a time, and rotation through memory banks 112a-112(n) proceeds in a directed order.

For example, a first DARF command refreshes memory cells at a selected row address in memory bank zero 112a. A second DARF command refreshes memory cells at the selected row address in memory bank one 112b. A third DARF command refreshes memory cells at the selected row address in memory bank two 112c. The DARF commands continue to be issued to the memory banks until the memory cells at the selected row address in memory bank N 112(n) have been refreshed. After the memory cells at the selected row address in each memory bank 112a-112(n) have been refreshed, the following DARF command refreshes the memory cells at the next row address in memory bank zero 112a. The DARF commands continue to be issued to refresh all memory cells at all row addresses in each memory bank 112a-112(n).

DARF scheduling improves the bandwidth of memory 106. In the typical auto-refresh with DARF mode disabled, all memory banks 112a-112(n) are precharged, and then an auto-refresh command is issued to refresh the memory cells at the selected row address in all the memory banks simultaneously. No operation (NOP) commands are issued during the auto-refresh to activate delay (tRFC) time. Once the tRFC time has expired, a memory bank 112a-112(n) can be activated and read and write operations can resume. With DARF mode enabled, a user can access a first memory bank 112a-112(n) continuously, issue a DARF command to a second memory bank 112a-112(n), and then continue on the next clock cycle to access the first memory bank 112a-112(n). With DARF mode enabled, DARF commands are issued at a rate four times that of typical auto-refresh commands for a memory having four memory banks, however, the tRFC time is not wasted on NOP commands.

In one embodiment, enabling and disabling DARF mode functionality for memory 106 is determined by setting or resetting a mode register set command. In another embodiment, a fuse within memory 106 is used to enable or disable DARF mode functionality. In one embodiment, a bank address counter (BAC) is used for incrementing through memory banks 112a-112(n) for DARF operations, and a row address counter (RAC) is used for incrementing through row addresses of memory banks 112a-112(n) for DARF operations. In one embodiment, a two-bit BAC is implemented as the two least significant bits of the RAC for DARF operations. The BAC is reset when DARF mode is entered and when self-refresh (SRF) mode exits to remain in sync with memory controller 102.

In one embodiment, control circuit 108 includes DARF mode command controls that use typical auto-refresh detection, timing, set, and reset circuitry. Transitions into and out of self-refresh mode are managed to avoid skipping memory banks or rows of memory cells. This management and control includes resetting the BAC to ensure no memory banks or rows of memory cells are skipped. In one embodiment, a dedicated BAC bus is used to select the memory bank 112a-112(n) on which to perform the DARF, thereby eliminating all timing constraints imposed by high-frequency back-to-back DARF and activate (ACT) commands. In one embodiment, a two-stage row address latch is used to allow high-frequency back-to-back DARF and ACT commands. A DARF command can be issued to one memory bank 112a-112(n) while another memory bank 112a-112(n) is active for read or write access. A directed auto-refresh command is blocked if the command is issued to an active memory bank 112a-112(n). The directed auto-refresh command, however, is reissued to the memory bank 112a-112(n) once read or write access to the memory bank 112a-112(n) is complete so as not to skip the auto-refresh of the memory bank 112a-112(n).

Figure 2:
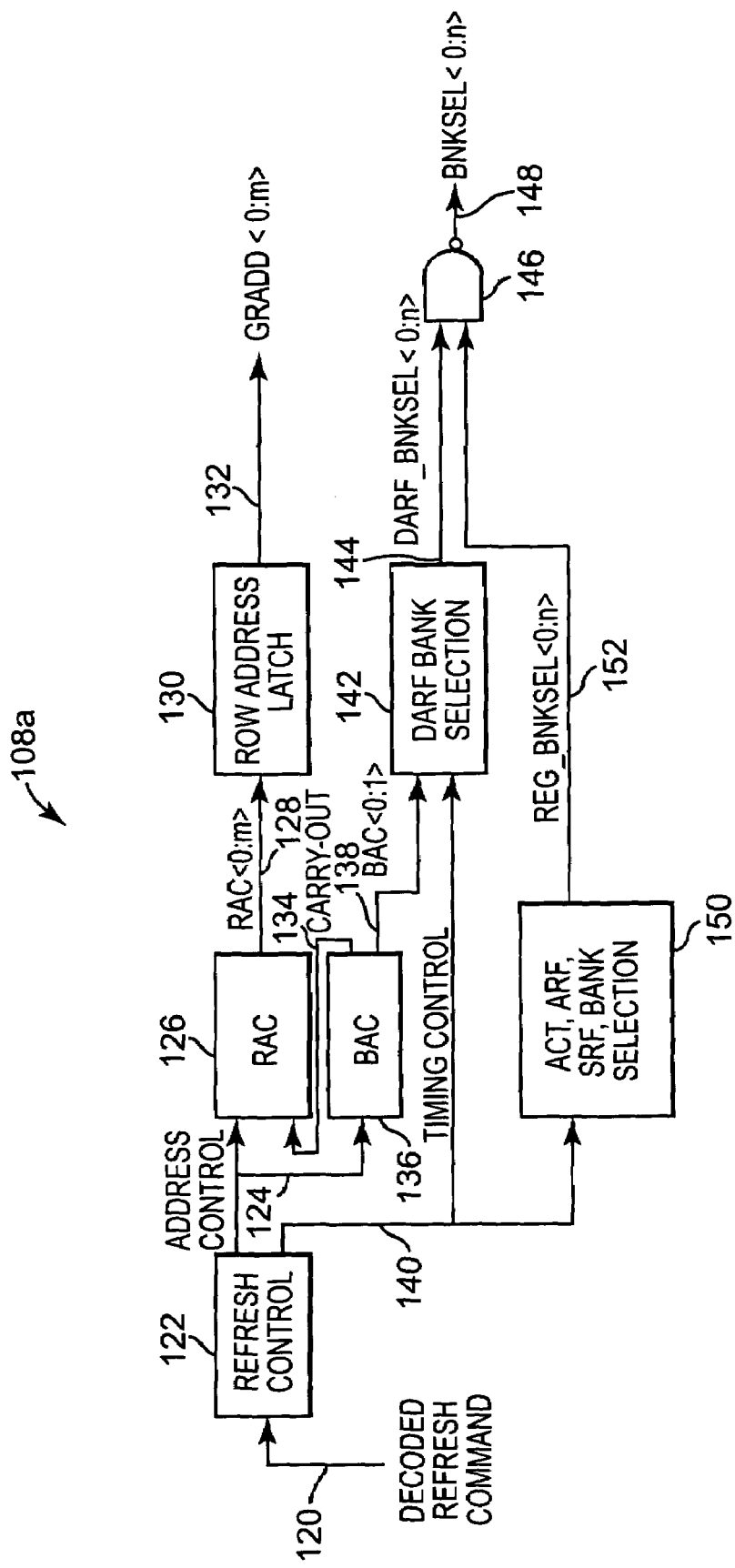
FIG. 2 is a block diagram illustrating one embodiment of a refresh control circuit.

FIG. 2 is a block diagram illustrating one embodiment of a refresh control circuit 108a. In one embodiment, refresh control circuit 108a is a portion of control circuit 108. Refresh control circuit 108a includes refresh control circuit 122, row address counter (RAC) 126, bank address counter (BAC) 136, row address latch 130, DARF bank selection circuit 142, activate (ACT), auto-refresh (ARF), self-refresh (SRF), and bank selection circuit 150, and NAND gate 146.

An input of refresh control circuit 122 receives a decoded refresh command on decoded refresh command communication path 120. An output of refresh control circuit 122 is electrically coupled to an input of RAC 126 and an input of BAC 136 through address control communication path 124. Another output of refresh control circuit 122 is electrically coupled to an input of DARF bank selection circuit 142 and an input of ACT, ARF, SRF, and bank selection circuit 150 through timing control communication path 140. An output of RAC 126 is electrically coupled to an input of row address latch 130 through row address counter address (RAC<0:m>) communication path 128. An output of BAC 136 is electrically coupled to an input of RAC 126 through carry-out (CARRY-OUT) signal path 134. Another output of BAC 136 is electrically coupled to DARF bank selection circuit 142 through bank address counter address (BAC<0:1>) communication path 138.

The output of row address latch 130 provides the global row address (GRADD<0:m>) on GRADD<0:m> communication path 132. The output of DARF bank selection circuit 142 is electrically coupled to a first input of NAND gate 146 through DARF bank selection (DARF_BNKSEL<0:n>) communication path 144. The output of ACT, ARF, SRF, and bank selection circuit 150 is electrically coupled to a second input of NAND gate 146 through regular bank select (REG_BNKSEL<0:n>) communication path 152. The output of NAND gate 146 provides the bank select (BANKSEL<0:n>) signals on BNKSEL<0:n> communication path 148.

Refresh control circuit 122 receives a decoded refresh command signal on decoded refresh command communication path 120 to provide address control signals on address control communication path 124 and timing control signals on timing control communication path 140. RAC 126 receives the address control signals on address control communication path 124 and the CARRY-OUT signal on CARRY-OUT signal path 134 to provide the RAC<0:m> signals on RAC<0:m> communication path 128. Based on the address control signals and the CARRY-OUT signal, RAC 126 increments through the row addresses of memory banks 112a-122(n) in self-refresh mode, in auto-refresh mode, or in directed auto-refresh mode for refreshing the memory cells at the row addresses.

BAC 136 receives the address control signals on address control communication path 124 to provide the BAC<0:1> signals on BAC<0:1> communication path 138 and the CARRY-OUT signal on CARRY-OUT signal path 134. Based on the address control signals, BAC 136 increments through the bank addresses of memory banks 112a-112(n) in DARF mode for refreshing the memory cells within each memory bank 112a-112(n). Each time the count of BAC 136 reaches the total number of memory banks "n" plus one, BAC 136 provides a logic high CARRY-OUT signal to increment RAC 126. BAC 136 is not used if DARF mode is disabled.

Row address latch 130 receives the RAC<0:m> signals on RAC<0:m> communication path 128 to provide the GRADD<0:m> signals on GRADD<0:m> communication path 132. Row address latch 130 latches the RAC<0:m> signals from RAC 126 in self-refresh, auto-refresh, or directed auto-refresh mode. Row address latch 130 latches the row addresses for a read or write operation from memory controller 102 during a memory bank activate command. Row address latch 130 provides the row addresses from memory controller 102 on GRADD<0:m> communication path 132 for an active memory bank read or write operation. Row address latch 130 provides the RAC<0:m> signals on GRADD<0:m> communication path 132 for an inactive memory bank self-refresh, auto-refresh, or directed auto-refresh operation.

DARF bank selection circuit 142 receives the BAC<0:1> signals on BAC<0:1> communication path 138 and the timing control signals on timing control communication path 140 to provide the DARF_BNKSEL<0:n> signals on DARF_BNKSEL<0:n> communication path 144. DARF bank selection circuit 142 selects the memory bank 112a-112(n) for a directed auto-refresh based on the BAC<0:1> signals and the timing control signals.

ACT, ARF, SRF, and bank selection circuit 150 receives the timing control signals on timing control communication path 140 to provide the REG_BNKSEL<0:n> signals on REG_BNKSEL<0:n> communication path 152. With DARF mode enabled or disabled, ACT, ARF, SRF, and bank selection circuit 150 selects the memory banks 112a-112(n) for activation and self-refresh based on the timing control signals. With DARF mode disabled, ACT, ARF, SRF, and bank selection circuit 150 also selects the memory banks 112a-112(n) for auto-refresh based on the timing control signals.

NAND gate 146 receives the DARF_BNKSEL<0:n> signals on DARF_BNKSEL<0:n> communication path 144 and the REG_BNKSEL<0:n> signals on REG_BNKSEL<0:n> communication path 152 to provide the BNKSEL<0:n> signals on BNKSEL<0:n> communication path 148. In response to a logic high DARF_BNKSEL<0:n> signal and a corresponding logic high REG_BNKSEL<0:n> signal, NAND gate 146 outputs a corresponding logic low BNKSEL<0:n> signal. In response to a logic low DARF_BNKSEL<0:n> signal or a corresponding logic low REG_BNKSEL<0:n> signal, NAND gate 146 outputs a corresponding logic high BNKSEL<0:n> signal.

In operation, with DARF mode disabled, BAC 136 and DARF bank selection circuit 142 are inactive and auto-refresh occurs in the typical manner with all memory banks 112a-112(n) refreshed simultaneously. With DARF mode enabled, BAC 136 and DARF bank selection circuit 142 are active and one memory bank 112a-112(n) is refreshed at a time based on the count of BAC 136 provided on BAC<0:1> communication path 138. Therefore, while one memory bank 112a-112(n) is being refreshed, another memory bank 112a-112(n) can be active for read or write operations. In one embodiment, a logic low DARF_BNKSEL<0:n> signal or a corresponding logic low REG_BNKSEL<0:n> signal selects the corresponding memory bank 112a-112(n) by providing a corresponding logic high BNKSEL<0:n> signal for activating or refreshing the selected memory bank 112a-112(n).

Figure 3:
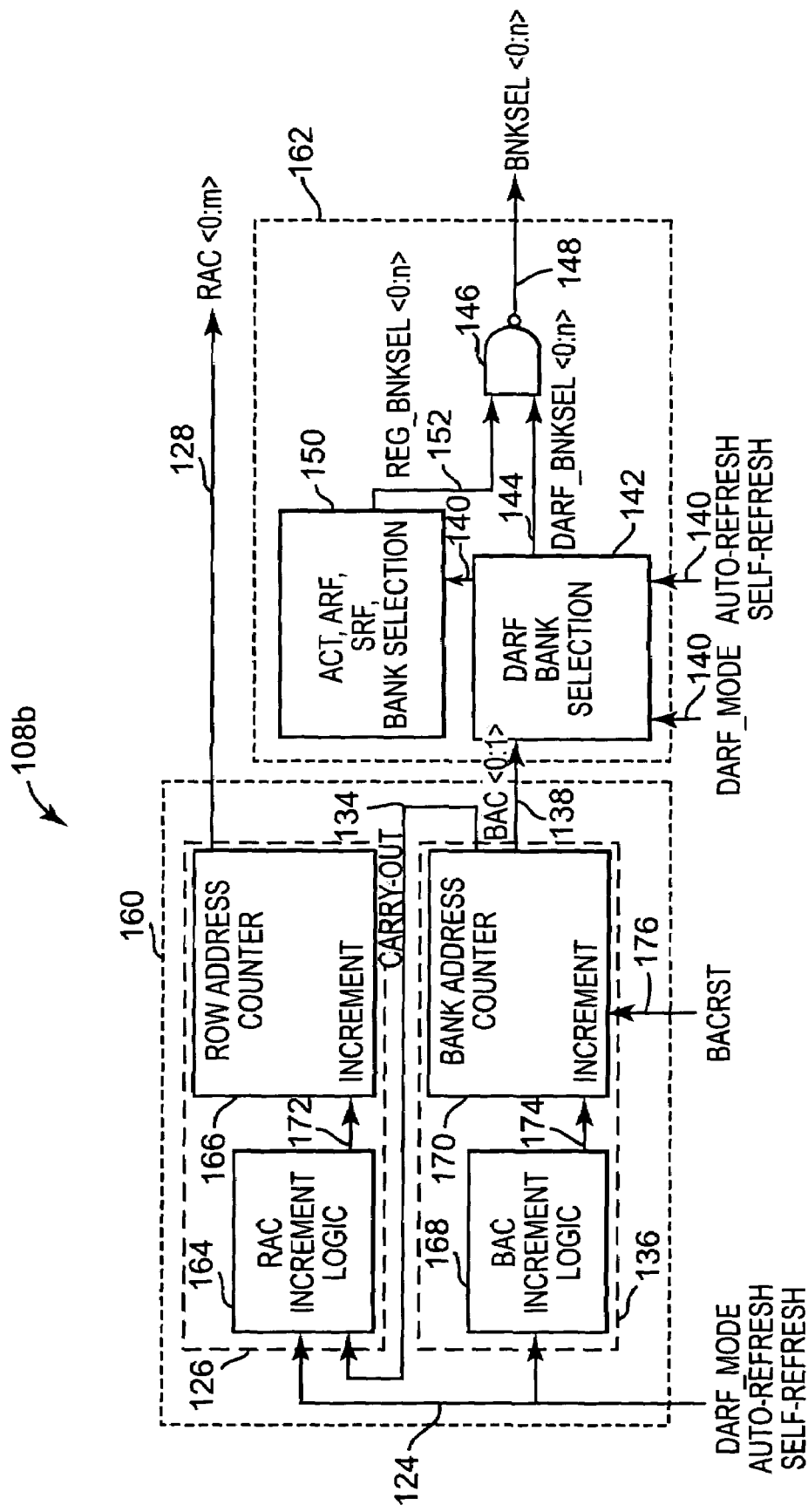
FIG. 3 is block diagram illustrating another embodiment of a refresh control circuit.

FIG. 3 is a block diagram illustrating another embodiment of a refresh control circuit 108b. In one embodiment, refresh control circuit 108b is a portion of control circuit 108. Refresh control circuit 108b includes an address counter block 160 and a row control block 162. Address counter block 160 includes RAC 126, which includes RAC increment logic 164 and row address counter 166. Address counter block 160 also includes BAC 136, which includes BAC increment logic 168 and bank address counter 170. Row control block 162 includes ACT, ARF, SRF, and bank selection circuit 150, DARF bank selection circuit 142, and NAND gate 146.

An input of RAC increment logic 164 and an input of BAC increment logic 168 receive the DARF_MODE, AUTO-REFRESH, and SELF-REFRESH signals on address control communication path 124. An output of RAC increment logic 164 is electrically coupled to the INCREMENT input of row address counter 166 through signal path 172. The output of row address counter 166 provides the RAC<0:m> signals on RAC<0:m> communication path 128. The output of BAC increment logic 168 is electrically coupled to the INCREMENT input of bank address counter 170 through signal path 174. An input of bank address counter 170 receives the BAC reset (BACRST) signal on BACRST signal path 176. An output of bank address counter 170 is electrically coupled to an input of RAC increment logic 164 through CARRY-OUT signal path 134. Another output of bank address counter 170 is electrically coupled to an input of DARF bank selection circuit 142 through BAC<0:1> communication path 138.

Inputs of DARF bank selection circuit 142 receive the DARF_MODE, AUTO-REFRESH, and SELF-REFRESH signals on timing control communication path 140. The output of DARF bank selection circuit 142 is electrically coupled to a first input of NAND gate 146 through DARF_BNKSEL<0:n> communication path 144. An input of ACT, ARF, SRF, and bank selection circuit 150 receives the AUTO-REFRESH and SELF-REFRESH signals on timing control communication path 140. The output of ACT, ARF, SRF, and bank selection circuit 150 is electrically coupled to a second input of NAND gate 146 through REG_BNKSEL<0:n> communication path 152. The output of NAND gate 146 provides the BNKSEL<0:n> signals on BNKSEL<0:n> communication path 148.

RAC increment logic 164 receives the DARF_MODE, AUTO-REFRESH, and SELF-REFRESH signals on address control communication path 124 and the CARRY-OUT signal on CARRY-OUT signal path 134 to provide the RAC increment signal on signal path 172. RAC increment logic 164 determines when to increment row address counter 166 based on the DARF_MODE, AUTO-REFRESH, SELF-REFRESH, and CARRY-OUT signals.

Row address counter 166 receives the RAC increment signal on signal path 172 to provide the RAC<0:m> signals on RAC<0:m> communication path 128. The count of row address counter 166 increments in response to each logic high RAC increment signal. The count of row address counter 166 is output on the RAC<0:m> signals.

BAC increment logic 168 receives the DARF_MODE, AUTO-REFRESH, and SELF-REFRESH signals on address control communication path 124 to provide the BAC increment signal on signal path 174. BAC increment logic 168 determines when to increment bank address counter 170 based on the DARF_MODE, AUTO-REFRESH, and SELF-REFRESH signals.

Bank address counter 170 receives the BAC increment signal on signal path 174 and the BACRST signal on BACRST signal path 176 to provide the CARRY-OUT signal on CARRY-OUT signal path 134 and the BAC<0:1> signals on BAC<0:1> communication path 138. The count of bank address counter 170 increments in response to each logic high BAC increment signal. The count of bank address counter 170 is reset in response to each logic high BACRST signal. In one embodiment, bank address counter 170 is implemented as the two least significant bits of row address counter 166. The count of bank address counter 170 is output on the BAC<0:1> signals.

ACT, ARF, SRF, and bank selection circuit 150 functions similarly to the ACT, ARF, SRF, and bank selection circuit 150 previously described with reference to FIG. 2. DARF bank selection circuit 142 functions similarly to the DARF bank selection circuit 142 previously described with reference to FIG. 2. NAND gate 146 functions similarly to the NAND gate 146 previously described with reference to FIG. 2. The overall operation of refresh control circuit 108*b* is similar to the operation of refresh control circuit 108*a* previously described with reference to FIG. 2.

Figure 4:
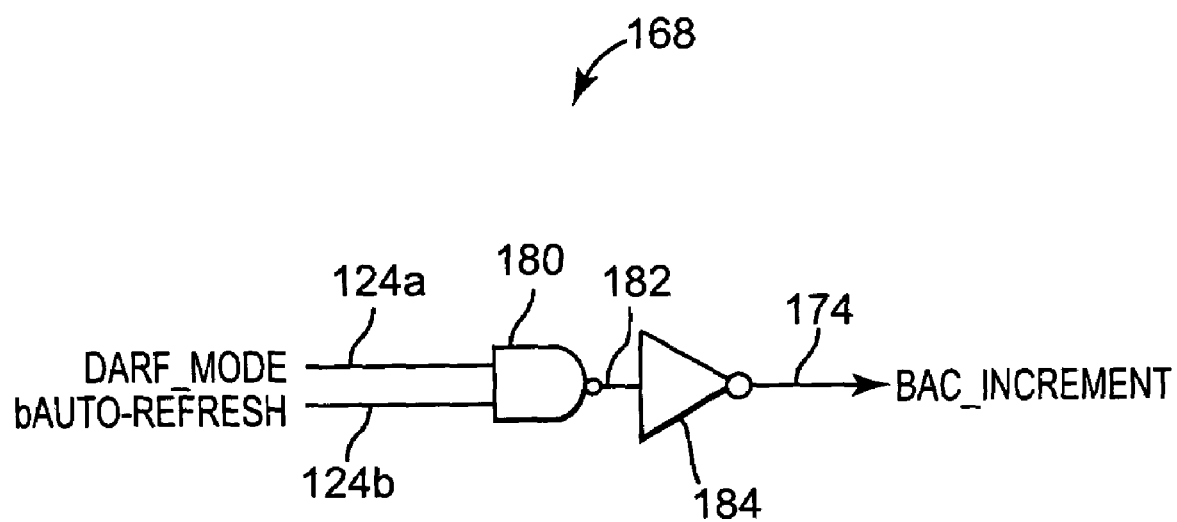
FIG. 4 is a diagram illustrating one embodiment of bank address counter increment logic.

FIG. 4 is a diagram illustrating one embodiment of BAC increment logic 168. BAC increment logic 168 includes NAND gate 180 and inverter 184. A first input of NAND gate 180 receives the DARF_MODE signal on DARF_MODE signal path 124*a*. A second input of NAND gate 180 receives the inverted auto refresh (bAUTO-REFRESH) signal on bAUTO-REFRESH signal path 124*b*. The output of NAND gate 180 is electrically coupled to the input of inverter 184 through signal path 182. The output of inverter 184 provides the BAC_INCREMENT signal on BAC_INCREMENT signal path 174.

The DARF_MODE signal on DARF_MODE signal path 124*a* is logic high if DARF mode is enabled and logic low if DARF mode is disabled. The bAUTO-REFRESH signal on bAUTO-REFRESH signal path 124*b* is logic low if an auto-refresh is in progress and logic high if an auto-refresh is not in progress. At the conclusion of an auto-refresh, the bAUTO-REFRESH signal transitions from logic low to logic high. In response to a logic high DARF_MODE signal and a logic high bAUTO-REFRESH signal, NAND gate 180 outputs a logic low signal on signal path 182. In response to a logic low DARF_MODE signal or a logic low bAUTO-REFRESH signal, NAND gate 180 outputs a logic high signal on signal path 182. Inverter 184 inverts the signal on signal path 182 to provide the BAC_INCREMENT signal on BAC_INCREMENT signal path 174.

In operation with DARF mode enabled, the DARF_MODE signal is logic high and the bAUTO-REFRESH signal transitions to logic high at the conclusion of each auto-refresh. In response to the logic high DARF_MODE signal and a logic high bAUTO-REFRESH signal, the BAC_INCREMENT signal transitions to logic high to increment the count of bank address counter 170. With DARF mode disabled, the DARF_MODE signal is logic low. In response to the logic low DARF_MODE signal, the BAC_INCREMENT signal is logic low and the count of bank address counter 170 does not increment.

FIG. 5A is a diagram illustrating one embodiment of RAC increment logic 164*a*. RAC increment logic 164*a* includes inverters 200 and 204 and NAND gates 208, 212, and 216. The input of inverter 200 receives the AUTO-REFRESH signal on AUTO-REFRESH signal path 124*d*. The output of inverter 200 is electrically coupled to a first input of NAND gate 208 through signal path 202. Inverter 202 receives the DARF_MODE signal on DARF_MODE signal path 124*a*. The output of inverter 204 is electrically coupled to a second input of NAND gate 208 through signal path 206. A first input of NAND gate 212 receives the DARF_MODE signal on DARF_MODE signal path 124*a*. A second input of NAND gate 212 receives the CARRY-OUT signal on CARRY-OUT signal path 134. The output of NAND gate 208 is electrically coupled to a first input of NAND gate 216 through signal path 210. The output of NAND gate 212 is electrically coupled to a second input of NAND gate 216 through signal path 214. A third input of NAND gate 216 receives the SELF-REFRESH signal on SELF-REFRESH signal path 124*c*. The output of NAND gate 216 provides the RAC_INCREMENT signal on RAC_INCREMENT signal path 172.

The SELF-REFRESH signal on SELF-REFRESH signal path 124*c* is logic high when a self-refresh is in progress and logic low when a self refresh is not in progress. The AUTO-REFRESH signal on AUTO-REFRESH signal path 124*d* is logic high when an auto-refresh is in progress and logic low when an auto-refresh is not in progress. Inverter 200 inverts the AUTO-REFRESH signal on AUTO-REFRESH signal path 124*d* to provide the signal on signal path 202. Inverter 204 inverts the DARF_MODE signal on DARF_MODE signal path 124*a* to provide the signal on signal path 206. In response to a logic high signal on signal path 202 and a logic high signal on signal path 206, NAND gate 208 outputs a logic low signal on signal path 210. In response to a logic low signal on signal path 210 or a logic low signal on signal path 206, NAND gate 208 outputs a logic high signal on signal path 210.

In response to a logic high DARF_MODE signal on DARF_MODE signal path 124*a* and a logic high CARRY-OUT signal on CARRY-OUT signal path 134, NAND gate 212 outputs a logic low signal on signal path 214. In response to a logic low DARF_MODE signal on DARF_MODE signal path 124 or a logic low CARRY-OUT signal on CARRY-OUT signal path 134, NAND gate 212 outputs a logic high signal on signal path 214.

In response to a logic high SELF-REFRESH signal on SELF-REFRESH signal path 124*c*, a logic high signal on signal path 210, and a logic high signal on signal path 214, NAND gate 216 outputs a logic low RAC_INCREMENT signal on RAC_INCREMENT signal path 172. In response to a logic low SELF-REFRESH signal on SELF-REFRESH signal path 124*c*, a logic low signal on signal path 210, or a logic low signal on signal path 214, NAND gate 216 outputs a logic high RAC_INCREMENT signal on RAC_INCREMENT signal path 172.

In operation with DARF mode enabled or disabled, a logic high RAC_INCREMENT signal is provided in response to a self-refresh exit. With DARF mode disabled, a logic high RAC_INCREMENT signal is provided in response to a completed auto-refresh. With DARF mode enabled, a logic high RAC_INCREMENT signal is provided in response to a logic high CARRY-OUT signal. In response to a logic high RAC_INCREMENT signal, the count of row address counter 166 increments. In response to a logic low RAC_INCREMENT signal, the count of row address counter 166 does not increment.

FIG. 5B is a diagram illustrating another embodiment of RAC increment logic 164*b*. RAC increment logic 164*b* includes OR gate 220, inverter 226, and transmission gates 224 and 230. A first input of OR gate 220 receives the AUTO-REFRESH signal on AUTO-REFRESH signal path 124*d*. A second input of OR gate 220 receives the SELF-REFRESH signal on SELF-REFRESH signal path 124*c*. The output of OR gate 220 is electrically coupled to the data input of transmission gate 224 through signal path 222. The input of inverter 226, the logic high enable input of transmission gate 230, and the logic low enable input of transmission gate 224 receive the DARF_MODE signal on DARF_MODE signal path 124*a*. The output of inverter 226 is electrically coupled to the logic high enable input of transmission gate 224 and the logic low enable input of transmission gate 230 through signal path 228. The data input of transmission gate 230 receives the CARRY-OUT signal on CARRY-OUT signal path 134. The data output of transmission gate 224 and the data output of transmission gate 230 provide the RAC_INCREMENT signal on RAC_INCREMENT signal path 172.

In response to a logic high AUTO-REFRESH signal on AUTO-REFRESH signal path 124d or a logic high SELF-REFRESH signal on SELF-REFRESH signal path 124c, OR gate 220 outputs a logic high signal on signal path 222. In response to a logic low AUTO-REFRESH signal on AUTO-REFRESH signal path 124d and a logic low SELF-REFRESH signal on SELF-REFRESH signal path 124c, OR gate 220 outputs a logic low signal on signal path 222. Inverter 226 inverts the DARF_MODE signal on DARF_MODE signal path 124a to provide the signal on signal path 228.

In response to a logic low DARF_MODE signal on DARF_MODE signal path 124a and a logic high signal on signal path 228, transmission gate 224 turns on to pass the signal on signal path 222 to RAC_INCREMENT signal path 172. In response to a logic high DARF_MODE signal on DARF_MODE signal path 124a and a logic low signal on signal path 228, transmission gate 224 turns off to block the signal on signal path 222 from passing to RAC_INCREMENT signal path 172.

In response to a logic low signal on signal path 228 and a logic high DARF_MODE signal on DARF_MODE signal path 124a, transmission gate 230 turns on to pass the CARRY-OUT signal on CARRY-OUT signal path 134 to RAC_INCREMENT signal path 172. In response to a logic high signal on signal path 228 and a logic low DARF_MODE signal on DARF_MODE signal path 124a, transmission gate 230 turns off to block the CARRY-OUT signal on CARRY-OUT signal path 134 from passing to RAC_INCREMENT signal path 172.

In operation with DARF mode disabled, a logic high RAC_INCREMENT signal is provided in response to a logic high SELF-REFRESH signal or a logic high AUTO-REFRESH signal. With DARF mode enabled, a logic high RAC_INCREMENT signal is provided in response to a logic high CARRY-OUT signal. In response to a logic high RAC_INCREMENT signal, the count of row address counter 166 increments. In response to a logic low RAC_INCREMENT signal, the count of row address counter 166 does not increment.

Figure 5C:
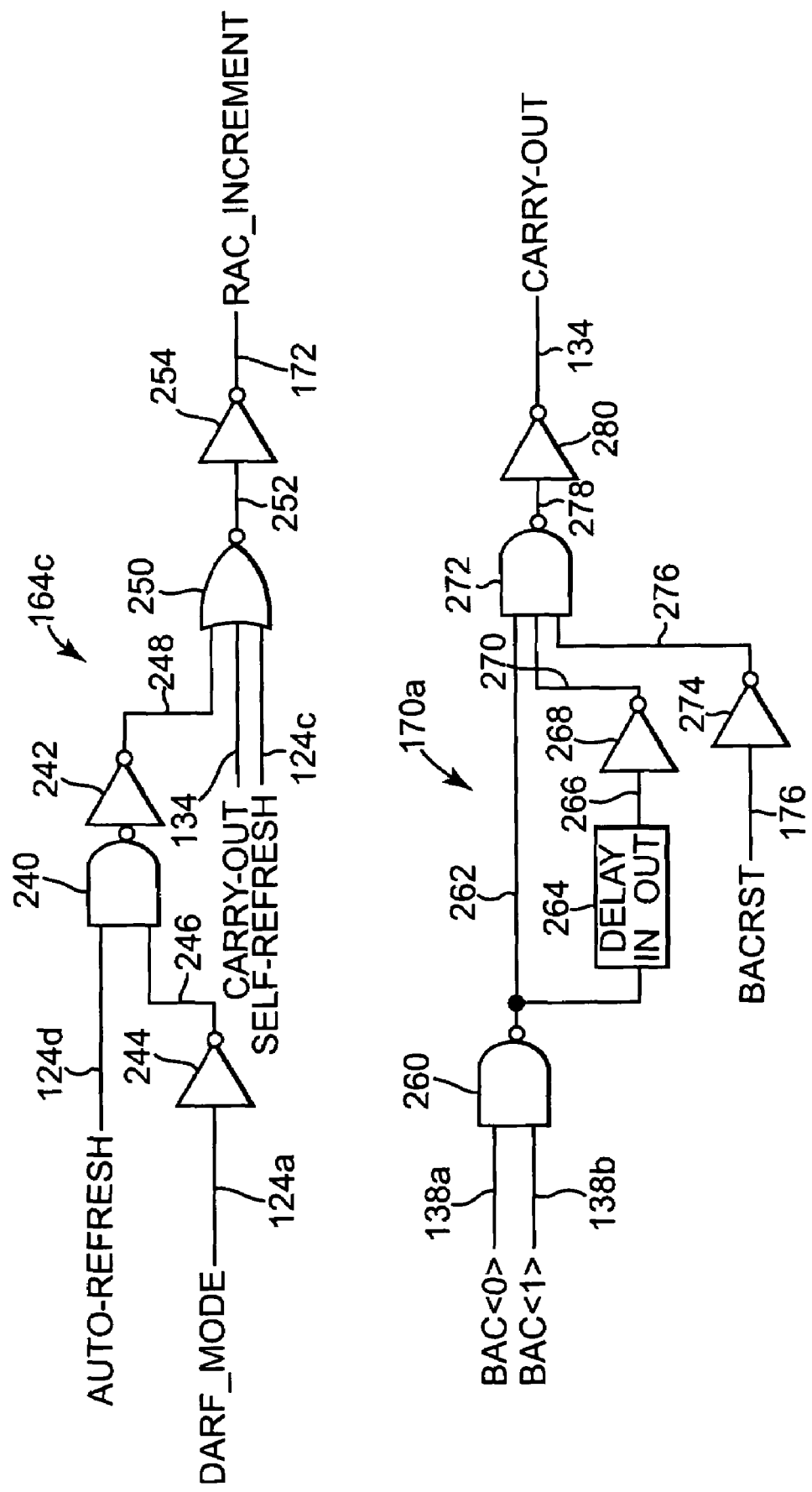
FIG. 5C is a diagram illustrating another embodiment of row address counter increment logic and bank address counter logic.

FIG. 5C is a diagram illustrating another embodiment of RAC increment logic 164c and a portion 170a of bank address counter 170. RAC increment logic 164c includes NAND gate 240, inverters 242, 244, and 254, and NOR gate 250. Portion 170a of bank address counter 170 includes NAND gates 260 and 272, delay 264, and inverters 268, 274, and 280.

The input of inverter 244 receives the DARF_MODE signal on DARF_MODE signal path 124a. The output of inverter 244 is electrically coupled to a first input of NAND gate 240 through signal path 246. A second input of NAND gate 240 receives the AUTO-REFRESH signal on AUTO-REFRESH signal path 124d. The output of NAND gate 240 is electrically coupled to the input of inverter 242. The output of inverter 242 is electrically coupled to a first input of NOR gate 250. A second input of NOR gate 250 receives the CARRY-OUT signal on CARRY-OUT signal path 134. A third input of NOR gate 250 receives the SELF-REFRESH signal on SELF-REFRESH signal path 124c. The output of NOR gate 250 is electrically coupled to the input of inverter 254. The output of inverter 254 provides the RAC_INCREMENT signal on RAC_INCREMENT signal path 172.

A first input of NAND gate 260 receives the BAC<0> signal on BAC<0> signal path 138a. A second input of NAND gate 260 receives the BAC<1> signal on BAC<1> signal path 138b. The output of NAND gate 260 is electrically coupled to a first input of NAND gate 272 and the input (IN) of delay 264 through signal path 262. The output (OUT) of delay 266 is electrically coupled to the input of inverter 268 through signal path 266. The output of inverter 268 is electrically coupled to a second input of NAND gate 272 through signal path 270. The input of inverter 274 receives the BACRST signal on BACRST signal path 176. The output of inverter 274 is electrically coupled to a third input of NAND gate 272 through signal path 276. The output of NAND gate 272 is electrically coupled to the input of inverter 280 through signal path 278. The output of inverter 280 provides the CARRY-OUT signal on CARRY-OUT signal path 134.

Inverter 244 inverts the DARF_MODE signal on DARF_MODE signal path 124a to provide the signal on signal path 246. In response to a logic high AUTO-REFRESH signal on AUTO-REFRESH signal path 124d and a logic high signal on signal path 246, NAND gate 240 outputs a logic low signal. In response to a logic low AUTO-REFRESH signal on AUTO-REFRESH signal path 124d or a logic low signal on signal path 246, NAND gate 240 outputs a logic high signal. Inverter 242 inverts the output signal from NAND gate 240 to provide the signal on signal path 248.

In response to a logic low signal on signal path 248, a logic low CARRY-OUT signal on CARRY-OUT signal path 134, and a logic low SELF-REFRESH signal on SELF-REFRESH signal path 124c, NOR gate 250 outputs a logic high signal on signal path 252. In response to a logic high signal on signal path 248, a logic high CARRY-OUT signal on CARRY-OUT signal path 134, or a logic high SELF-REFRESH signal on SELF-REFRESH signal path 124c, NOR gate 250 outputs a logic low signal on signal path 252. Inverter 254 inverts the signal on signal path 252 to provide the RAC_INCREMENT signal on RAC_INCREMENT signal path 172.

In response to a logic high BAC<0> signal on BAC<0> signal path 138a and a logic high BAC<1> signal on BAC<1> signal path 138b, NAND gate 260 outputs a logic low signal on signal path 262. In response to a logic low BAC<0> signal on BAC<0> signal path 138a or a logic low BAC<1> signal on BAC<1> signal path 138b, NAND gate 260 outputs a logic high signal on signal path 262. Delay 264 delays the signal on signal path 262 to provide the signal on signal path 266. Inverter 268 inverts the signal on signal path 266 to provide the signal on signal path 270. Inverter 272 inverts the BACRST signal on BACRST signal path 176 to provide the signal on signal path 276.

In response to a logic high signal on signal path 262, a logic high signal on signal path 270, and a logic high signal on signal path 276, NAND gate 272 outputs a logic low signal on signal path 278. In response to a logic low signal on signal path 262, a logic low signal on signal path 270, or a logic low signal on signal path 276, NAND gate 272 outputs a logic high signal on signal path 278. Inverter 280 inverts the signal on signal path 278 to provide the CARRY-OUT signal on CARRY-OUT signal path 134.

In operation, portion 170a of bank address counter 170 provides a logic high CARRY-OUT pulse in response to a logic low BACRST signal and the BAC<0> signal and the BAC<1> signal both transitioning from logic high to logic low (i.e. the count of bank address counter 170 resets from "11" to "00"). In response to a logic high BACRST signal, the CARRY-OUT signal remains logic low while the count of bank address counter 170 is reset.

In operation with DARF mode enabled, a logic high RAC_INCREMENT signal is provided in response to a logic high SELF-REFRESH signal or a logic high CARRY-OUT signal. With DARF mode disabled, a logic high RAC_INCREMENT signal is provided in response to a logic high AUTO-REFRESH signal or a logic high SELF-REFRESH signal. In response to a logic high RAC_INCREMENT signal, the count of row address counter 166 increments. In response to a logic low RAC_-INCREMENT signal, the count of row address counter 166 does not increment.

Figure 6:
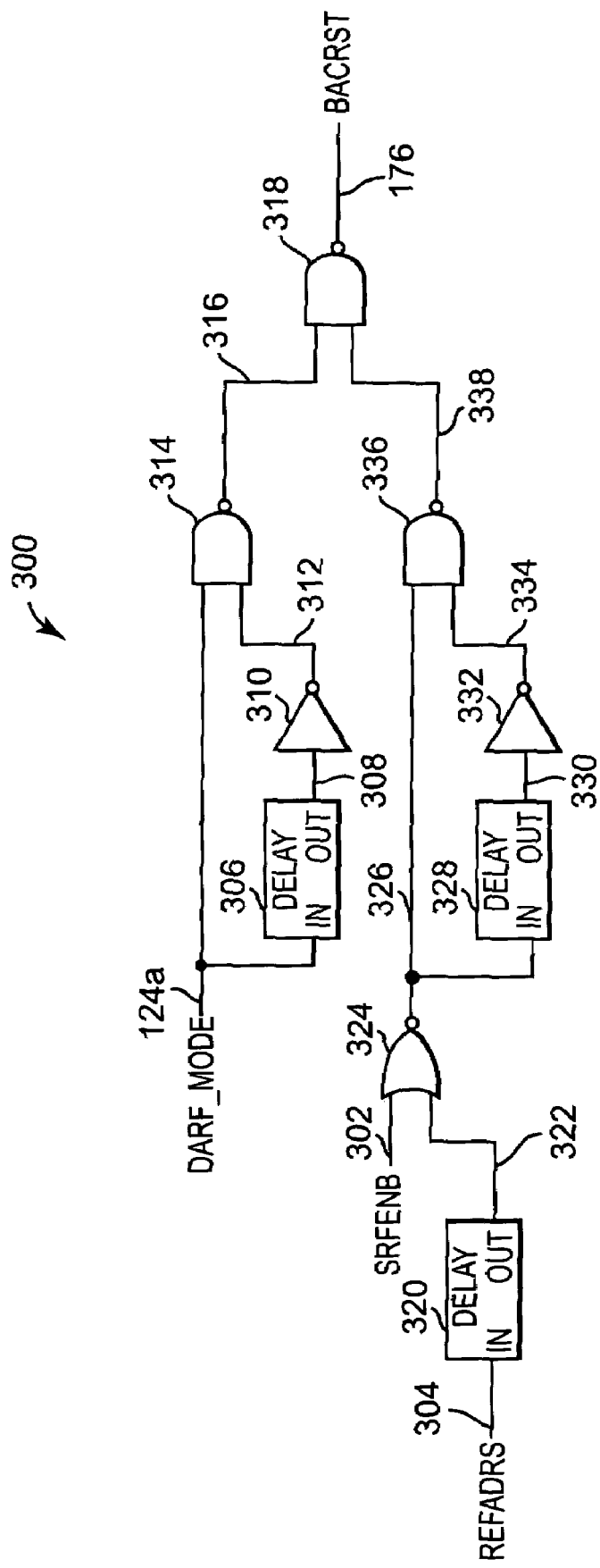
FIG. 6 is a diagram illustrating one embodiment of a circuit for resetting a bank address counter.

FIG. 6 is a diagram illustrating one embodiment of a circuit 300 for resetting bank address counter 170. Circuit 300 includes delays 306, 320, and 328, NOR gate 324, inverters 310 and 332, and NAND gates 314, 318, and 336. A first input of NAND gate 314 and the input (IN) of delay 306 receive the DARF_MODE signal on DARF_MODE signal path 124a. The output (OUT) of delay 306 is electrically coupled to the input of inverter 310 through signal path 308. The output of inverter 310 is electrically coupled to a second input of NAND gate 314 through signal path 312. The output of NAND gate 314 is electrically coupled to a first input of NAND gate 318 through signal path 316.

The input (IN) of delay 320 receives the refresh address (REFADRS) signal on REFADRS signal path 304. The output (OUT) of delay 320 is electrically coupled to a first input of NOR gate 324 through signal path 322. A second input of NOR gate 324 receives the self-refresh enable (SRFENB) signal on SRFENB signal path 302. The output of NOR gate 324 is electrically coupled to a first input of NAND gate 336 and the input (IN) of delay 328 through signal path 326. The output (OUT) of delay 328 is electrically coupled to the input of inverter 332 through signal path 330. The output of inverter 332 is electrically coupled to a second input of NAND gate 336 through signal path 334. The output of NAND gate 336 is electrically coupled to a second input of NAND gate 318 through signal path 338. The output of NAND gate 318 provides the BACRST signal on BACRST signal path 176.

The SRFENB signal is logic high if a self-refresh or auto-refresh is in progress and logic low if a self-refresh or auto-refresh is not in progress. The REFADRS signal is used to select between the row addresses for a memory bank read or write operation and the row addresses from row address counter 166 for a memory bank refresh. The REFADRS signal is logic high for at least the start of a memory bank refresh. After a memory bank refresh has started or for a memory bank read or write operation, the REFADRS signal is logic low.

Delay 306 delays the DARF_MODE signal on DARF_MODE signal path 124a to provide the signal on signal path 308. Inverter 310 inverts the signal on signal path 308 to provide the signal on signal path 312. In response to a logic high DARF_MODE signal on DARF_MODE signal path 124a and a logic high signal on signal path 312, NAND gate 314 outputs a logic low signal on signal path 316. In response to a logic low DARF_MODE signal on DARF_MODE signal path 124a or a logic low signal on signal path 312, NAND gate 314 outputs a logic high signal on signal path 316.

Delay 320 delays the REFADRS signal on REFADRS signal path 304 to provide the signal on signal path 322. In response to a logic low SRFENB signal on SRFENB signal path 302 and a logic low signal on signal path 322, NOR gate 324 outputs a logic high signal on signal path 326. In response to a logic high SRFENB signal on SRFENB signal path 302 or a logic high signal on signal path 322, NOR gate 324 outputs a logic low signal on signal path 326.

Delay 328 delays the signal on signal path 326 to provide the signal on signal path 330. Inverter 332 inverts the signal on signal path 330 to provide the signal on signal path 334. In response to a logic high signal on signal path 326 and a logic high signal on signal path 334, NAND gate 336 outputs a logic low signal on signal path 338. In response to a logic low signal on signal path 326 or a logic low signal on signal path 334, NAND gate 336 outputs a logic high signal on signal path 338.

In response to a logic high signal on signal path 316 and a logic high signal on signal path 338, NAND gate 318 outputs a logic low BACRST signal on BACRST signal path 176. In response to a logic low signal on signal path 316 or a logic low signal on signal path 338, NAND gate 318 outputs a logic high signal on BACRST signal path 176.

In operation, when DARF mode is enabled the DARF_MODE signal transitions from logic low to logic high. In response to the DARF_MODE signal transitioning to logic high, a pulse is provided on BACRST signal path 176. When self-refresh exits, the SRFENB signal transitions from logic high to logic low. In response to the SRFENB signal transitioning to logic low, a pulse is provided on BACRST signal path 176.

After an auto-refresh has started, the REFADRS signal transitions from logic high to logic low. In response to the REFADRS signal transitioning to logic low and after a delay defined by delay 320, a pulse is provided on BACRST signal path 176. Row address counter 166 is incremented when self-refresh exits. Bank address counter 170 is reset after row address counter 166 is incremented to prevent skipping bank zero 112a for the following row address. In response to a logic high BACRST signal, the count of bank address counter 170 is reset. In response to a logic low BACRST signal, the count of bank address counter 170 is not reset.

Figure 7A:
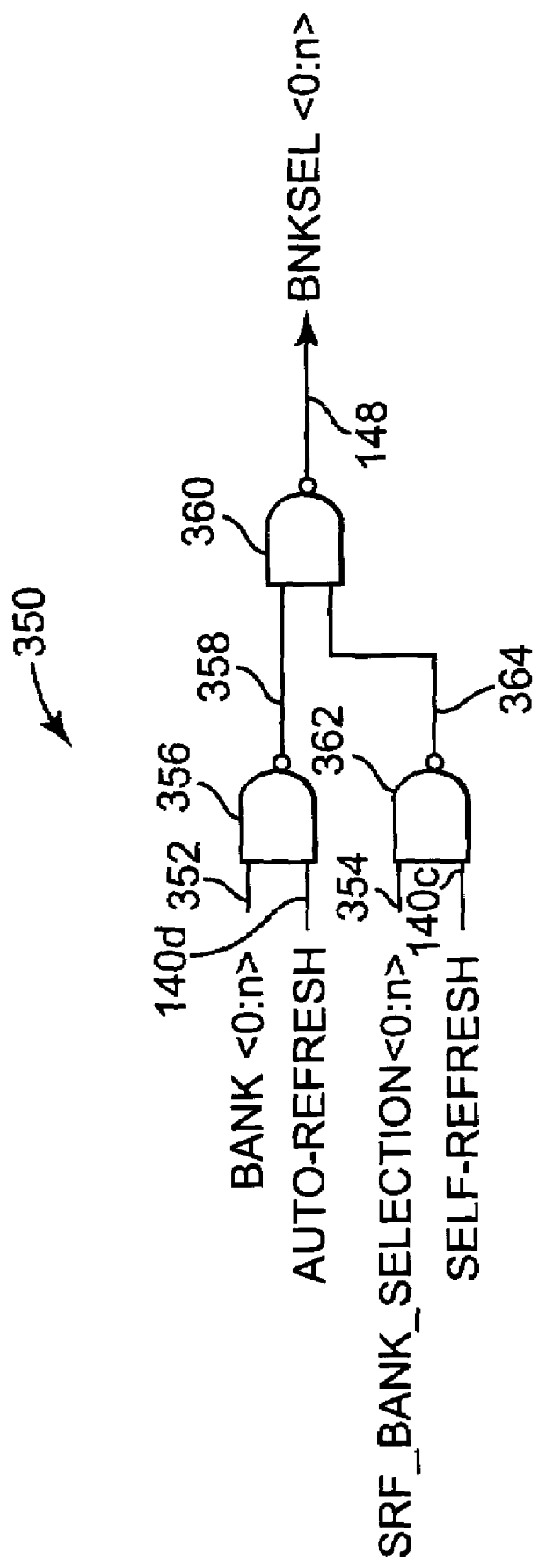
FIG. 7A is a diagram illustrating one embodiment of a circuit for selecting memory banks.

FIG. 7A is a diagram illustrating one embodiment of a circuit 350 for selecting memory banks 112a-112(n). Circuit 350 includes NAND gates 356, 362, and 360. A first input of NAND gate 356 receives the BANK<0:n> signals on BANK<0:n> communication path 352. A second input of NAND gate 356 receives the AUTO-REFRESH signal on AUTO-REFRESH signal path 140d. The output of NAND gate 356 is electrically coupled to a first input of NAND gate 360 through communication path 358. A first input of NAND gate 362 receives the SRF_BANK_SELECTION<0:n> signals on SRF_BANK_SELECTION<0:n> communication path 354. A second input of NAND gate 362 receives the SELF-REFRESH signal on SELF-REFRESH signal path 140c. The output of NAND gate 362 is electrically coupled to a second input of NAND gate 360 through communication path 364. The output of NAND gate 360 provides the BNKSEL<0:n> signals on BNKSEL<0:n> communication path 148.

The BANK<0:n:> signals are logic high for all memory banks 112a-112(n) with DARF mode disabled. With DARF mode enabled, the BANK<0:n> signals are logic high for the memory bank 112a-112(n) to be auto-refreshed and logic low for the memory banks 112a-112(n) not being auto-refreshed. The SRF_BANK_SELECTION<0:n> signals are logic high for the memory banks 112a-112(n) being refreshed in self-refresh mode and logic low for the memory banks 112a-112(n) not being refreshed in self-refresh mode.

In response to a logic high BANK<0:n> signal on BANK<0:n> communication path 352 and a logic high AUTO-REFRESH signal on AUTO-REFRESH signal path 140d, NAND gate 356 outputs a corresponding logic low signal on communication path 358. In response to a logic low BANK<0:n> signal on BANK<0:n> communication path 352 or a logic low AUTO-REFRESH signal on AUTO-REFRESH signal path 140d, NAND gate 356 outputs a corresponding logic high signal on communication path 358.

In response to a logic high SRF_BANK_SELECTION<0:n> signal on SRF_BANK_SELECTION<0:n> communication path 354 and a logic high SELF-REFRESH signal on SELF-REFRESH signal path 140c, NAND gate 362 outputs a corresponding logic low signal on communication path 364. In response to a logic low SRF_BANK_SELECTION<0:n> signal on SRF_BANK_SELECTION<0:n> communication path 354 or a logic low SELF-REFRESH signal on SELF-REFRESH signal path 140c, NAND gate 362 outputs a corresponding logic high signal on communication path 364.

In response to a logic high signal on communication path 358 and a corresponding logic high signal on communication path 364, NAND gate 360 outputs a corresponding logic low BNKSEL<0:n> signal on BNKSEL<0:n> communication path 148. In response to a logic low signal on communication path 358 or a corresponding logic low signal on communication path 364, NAND gate 360 outputs a corresponding logic high BNKSEL<0:n> signal on BNKSEL<0:n> communication path 148.

In operation, the AUTO-REFRESH signal is combined with the BANK<0:n> signals and the SRF_BANK_SELECTION<0:n> signals are combined with the SELF-REFRESH signal to select the designated memory banks 112a-112(n). A logic high BNKSEL<0:n> signal for a memory bank 112a-112(n) indicates the memory bank 112a-112(n) is selected.

Figure 7B:
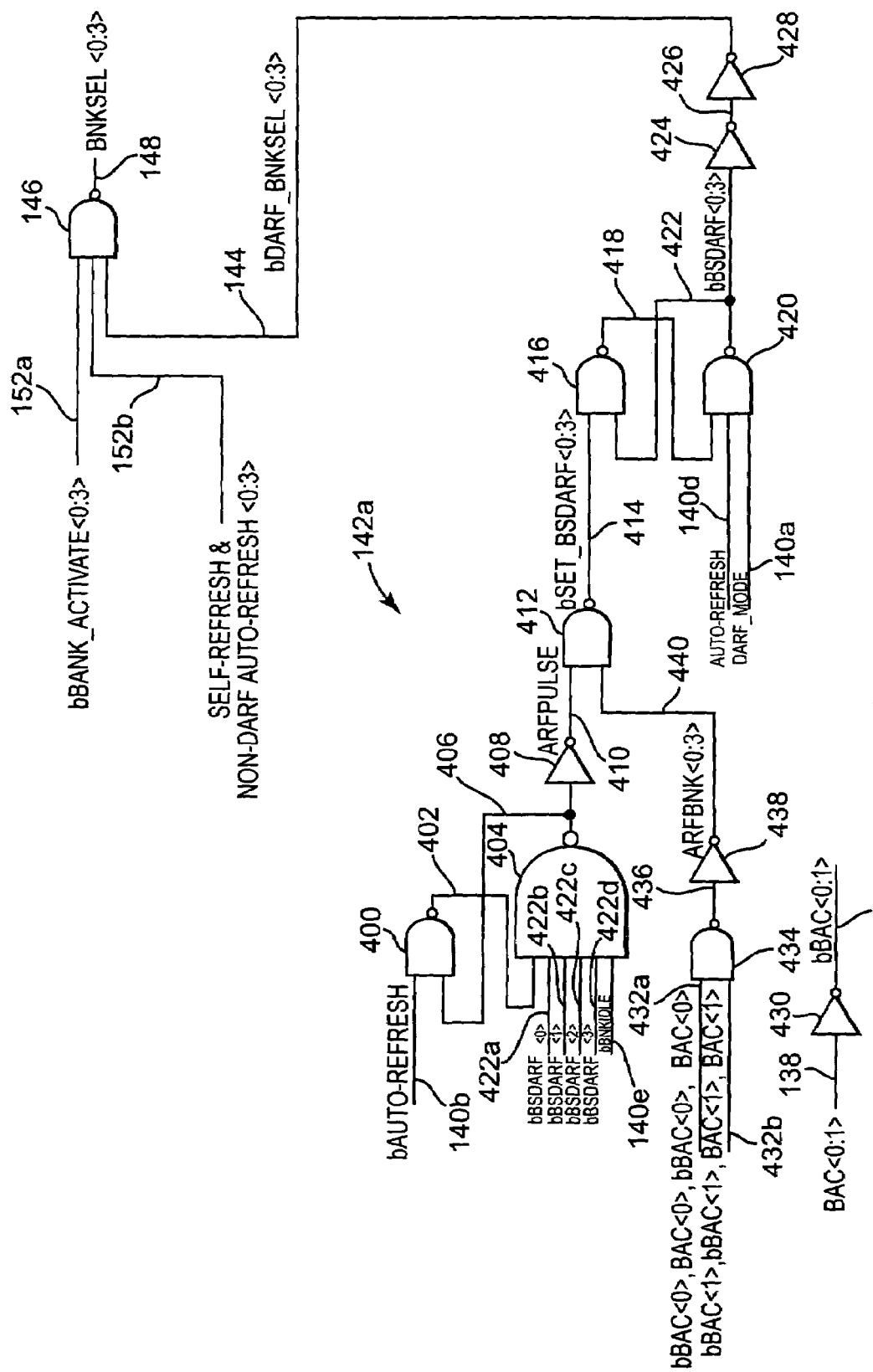
FIG. 7b is a diagram illustrating another embodiment of a circuit for selecting memory banks.

FIG. 7B is a diagram illustrating another embodiment of a circuit for selecting memory banks 112a-112(n) including DARF bank selection circuit 142a and NAND gate 146. In this embodiment, n equals 3. DARF bank selection circuit 142a includes NAND gates 400, 404, 412, 416, 420, and 434 and inverters 408, 424, 428, 430, and 438. A first input of NAND gate 400 receives the bAUTO-REFRESH signal on bAUTO-REFRESH signal path 140b. The output of NAND gate 400 is electrically coupled to a first input of NAND gate 404 through signal path 402. The output of NAND gate 404 is electrically coupled to a second input of NAND gate 400 and the input of inverter 408 through signal path 406. A second input of NAND gate 404 receives the inverted bank idle (bBNKIDLE) signal on bBNKIDLE signal path 140e. The output of inverter 408 is electrically coupled to a first input of NAND gate 412 through auto-refresh pulse (ARFPULSE) signal path 410.

The input of inverter 430 receives the BAC<0:1> signals on BAC<0:1> communication path 138. The output of inverter 430 provides the bBAC<0:1> signals on bBAC<0:1> communication path 432. A first input of NAND gate 434 receives the bBAC<0>, BAC<0>, bBAC<0>, and BAC<0> signals through communication path 432a. A second input of NAND gate 434 receives the bBAC<1>, bBAC<1>, BAC<1>, and BAC<1> signals through communication path 432b. The output of NAND gate 434 is electrically coupled to the input of inverter 438 through communication path 436. The output of inverter 438 is electrically coupled to a second input of NAND gate 412 through auto-refresh bank (ARFBNK<0:3>) communication path 440. The output of NAND gate 412 is electrically coupled to a first input of NAND gate 416 through inverted set bank select for DARF (bSET_BSDARF<0:3>) communication path 414.

The output of NAND gate 416 is electrically coupled to a first input of NAND gate 420 through communication path 418. The output of NAND gate 420 is electrically coupled to a second input of NAND gate 416, the input of inverter 424, and the inputs of NAND gate 404 through bBSDARF<0:3> communication path 422. A third input of NAND gate 404 receives the bBSBARF<0> signal on bBSBARF<0> signal path 422a. A fourth input of NAND gate 404 receives the bBSBARF<1> signal on bBSBARF<1> signal path 422b. A fifth input of NAND gate 404 receives the bBSBARF<2> signal on bBSBARF<2> signal path 422c. A sixth input of NAND gate 404 receives the bBSBARF<3> signal on bBSBARF<3> signal path 422d. A second input of NAND gate 420 receives the AUTO-REFRESH signal on AUTO-REFRESH signal path 140d. A third input of NAND gate 420 receives the DARF_MODE signal on DARF_MODE signal path 140a. The output of inverter 424 is electrically coupled to the input of inverter 428 through communication path 426. The output of inverter 428 is electrically coupled to a first input of NAND gate 146 through bDARF_BNKSEL<0:3> communication path 144.

A second input of NAND gate 146 receives the inverted bank activate (bBANK_ACTIVATE<0:3>) signals on bBANK_ACTIVATE<0:3>communication path 152a. A third input of NAND gate 146 receives the SELF-REFRESH and NON-DARF AUTO-REFRESH<0:3> signals on SELF-REFRESH and NON-DARF AUTO-REFRESH<0:3> communication path 152b. The output of NAND gate 146 provides the BNKSEL<0:3> signals on BNKSEL<0:3> communication path 148.

The bBANK_ACTIVATE<0:3> signals are logic low for each memory bank 112a-112(n) selected to be activated and logic high for each memory bank 112a-112(n) not selected to be activated. The SELF-REFRESH and NON-DARF AUTO-REFRESH<0:3> signals are logic low for each memory bank 112a-112(n) selected to be self-refreshed. The SELF-REFRESH and NON-DARF AUTO-REFRESH<0:3> signals are also logic low for each memory bank 112a-112(n) selected to be auto-refreshed with DARF mode disabled. The SELF-REFRESH and NON-DARF AUTO-REFRESH<0:3> signals are logic high for each memory bank 112a-112(n) not being self-refreshed or not being auto-refreshed with DARF mode disabled. The bBNKIDLE signal is logic low if all memory banks 112a-112(n) are idle and logic high if a memory bank 112a-112(n) is being precharged or is active.

In response to a logic high bAUTO-REFRESH signal on bAUTO-REFRESH signal path 140b and a logic high signal on signal path 406, NAND gate 400 outputs a logic low signal on signal path 402. In response to a logic low bAUTO-REFRESH signal on bAUTO-REFRESH signal path 140b or a logic low signal on signal path 406, NAND gate 400 outputs a logic high signal on signal path 402.

In response to a logic high signal on signal path 402, a logic high bBSDARF<0> signal on BSDARF<0> signal path 422a, a logic high bBSDARF<1> signal on BSDARF<1> signal path 422b, a logic high bBSDARF<2> signal on BSDARF<2> signal path 422c, a logic high bBSDARF<3> signal on BSDARF<3> signal path 422d, and a logic high bBNKIDLE signal on bBNKIDLE signal path 140e, NAND gate 404 outputs a logic low signal on signal path 406. In response to a logic low signal on signal path 402, a logic low bBSDARF<0> signal on BSDARF<0> signal path 422a, a logic low bBSDARF<1> signal on BSDARF<1> signal path 422b, a logic low bBSDARF<2> signal on BSDARF<2> signal path 422c, a logic low bBSDARF<3> signal on BSDARF<3> signal path 422d, or a logic low bBNKIDLE signal on bBNKIDLE signal path 140e, NAND gate 404 outputs a logic high signal on signal path 406. NAND gate 400 and NAND gate 404 provide a latch.

Inverter 408 inverts the signal on signal path 406 to provide the ARFPULSE signal on ARFPULSE signal path 410. Inverter 430 inverts the BAC<0:1> signals on BAC<0:1> communication path 138 to provide the bBAC<0:1> signals on bBAC<0:1> communication path 432. In response to a logic high signal on communication path 432a and a corresponding logic high signal on communication path 432b, NAND gate 434 outputs a corresponding logic low signal on communication path 436. In response to a logic low signal on communication path 432a or a corresponding logic low signal on communication path 432b, NAND gate 434 outputs a corresponding logic high signal on communication path 436.

Inverter 438 inverts the signals on communication path 436 to provide the ARFBNK<0:3> signals on ARFBNK<0:3> communication path 440. In response to a logic high ARFPULSE signal on ARFPULSE signal path 410 and a logic high ARFBNK<0:3> signal on ARFBNK<0:3> communication path 440, NAND gate 412 outputs a corresponding logic low bSET_BSDARF<0:3> signal on bSET_BSDARF<0:3> communication path 414. In response to a logic low ARFPULSE signal on ARFPULSE signal path 410 or a logic low ARFBNK<0:3> signal on ARFBANK<0:3> communication path 440, NAND gate 412 outputs a corresponding logic high bSET-BSDARF<0:3> signal on bSET_BSDARF<0:3> communication path 414.

In response to a logic high bSET_BSDARF<0:3> signal on bSET_BSDARF<0:3> communication path 414 and a corresponding logic high bBSDARF<0:3> signal on bBSDARF<0:3> communication path 422, NAND gate 416 outputs a corresponding logic low signal on communication path 418. In response to a logic low bSET_BSDARF<0:3> signal on bSET_BSDARF<0:3> communication path 414 or a corresponding logic low bBSDARF<0:3> signal on bBSDARF<0:3> communication path 422, NAND gate 416 outputs a corresponding logic high signal on communication path 418.

In response to a logic high signal on communication path 418, a logic high AUTO-REFRESH signal on AUTO-REFRESH signal path 140d, and a logic high DARF_MODE signal on DARF_MODE signal path 140a, NAND gate 420 outputs a corresponding logic low bBSDARF<0:3> signal on bBSDARF<0:3> communication path 422. In response to a logic low signal on communication path 418, a logic low AUTO-REFRESH signal on AUTO-REFRESH signal path 140d, or a logic low DARF_MODE signal on DARF_MODE signal path 140a, NAND gate 420 outputs a corresponding logic high bBSDARF<0:3> signal on bBSDARF<0:3> communication path 422. NAND gate 416 and NAND gate 420 provide a latch.

Inverter 424 inverts the bBSDARF<0:3> signals on bBSDARF<0:3> communication path 422 to provide the signals on communication path 426. Inverter 428 inverts a signals on communication path 426 to provide the bDARF_BNKSEL<0:3> signals on bDARF_BNKSEL<0:3> communication path 144.

In response to a logic high bBANK_ACTIVATE<0:3> signal on bBANK_ACTIVATE<0:3> communication path 152a, a corresponding logic high SELF-REFRESH and NON-DARF AUTO-REFRESH<0:3> signal on SELF-REFRESH and NON-DARF AUTO-REFRESH<0:3> communication path 152b, and a corresponding logic high bDARF_BNKSEL<0:3> signal on bDARF_BNKSEL<0:3> communication path 144, NAND gate 146 outputs a corresponding logic low BNKSEL<0:3> signal on BNKSEL<0:3> communication path 148. In response to a logic low bBANK_ACTIVATE<0:3> signal on bBANK_ACTIVATE<0:3> communication path 152a, a corresponding logic low SELF-REFRESH and NON-DARF AUTO-REFRESH<0:3> signal on SELF-REFRESH and NON-DARF AUTO-REFRESH<0:3> communication path 152b, or a corresponding logic low bDARF_BNKSEL<0:3> signal on bDARF_BNKSEL<0:3> communication path 144, NAND gate 146 outputs a corresponding logic high BNKSEL<0:3> signal on BNKSEL<0:3> communication path 148.

In operation, the BAC<0:1> signals provide the memory bank address for the next memory bank 112a-112(n) to be refreshed in DARF mode. The memory bank addresses are decoded into a single value for each memory bank to provide the ARFBNK<0:3> signals. When the auto-refresh command is decoded, it produces the bAUTO-REFRESH signal, which sets the first set/reset latch provided by NAND gate 400 and NAND gate 404. This generates the ARFPULSE signal, which combines with the ARFBANK<0:3> signals to provide the bSET_BSDARF<0:3> signals, which pulse logic low for the memory bank 112a-112(n) on which the DARF is to be performed. This sets the memory bank selection set/reset latch (NAND gate 416 and NAND gate 420) for that memory bank. The bBSDARF<0:3> signals then return to reset the first set/reset latch of NAND gate 400 and NAND gate 404, which releases the set for the second set/reset latch of NAND gate 416 and NAND gate 420. The memory bank selection is released when the auto-refresh is over.

The DARF_MODE signal is an input to the second set/reset latch provided by NAND gates 416 and 420 so that the latch is held in the reset state when DARF mode is disabled. The BNKIDLE signal transitions to logic low when the refresh operation is complete. The BNKIDLE signal is an input to NAND gate 404 to reset the latch of NAND gate 400 and 404 when the refresh is complete.

Figure 8:
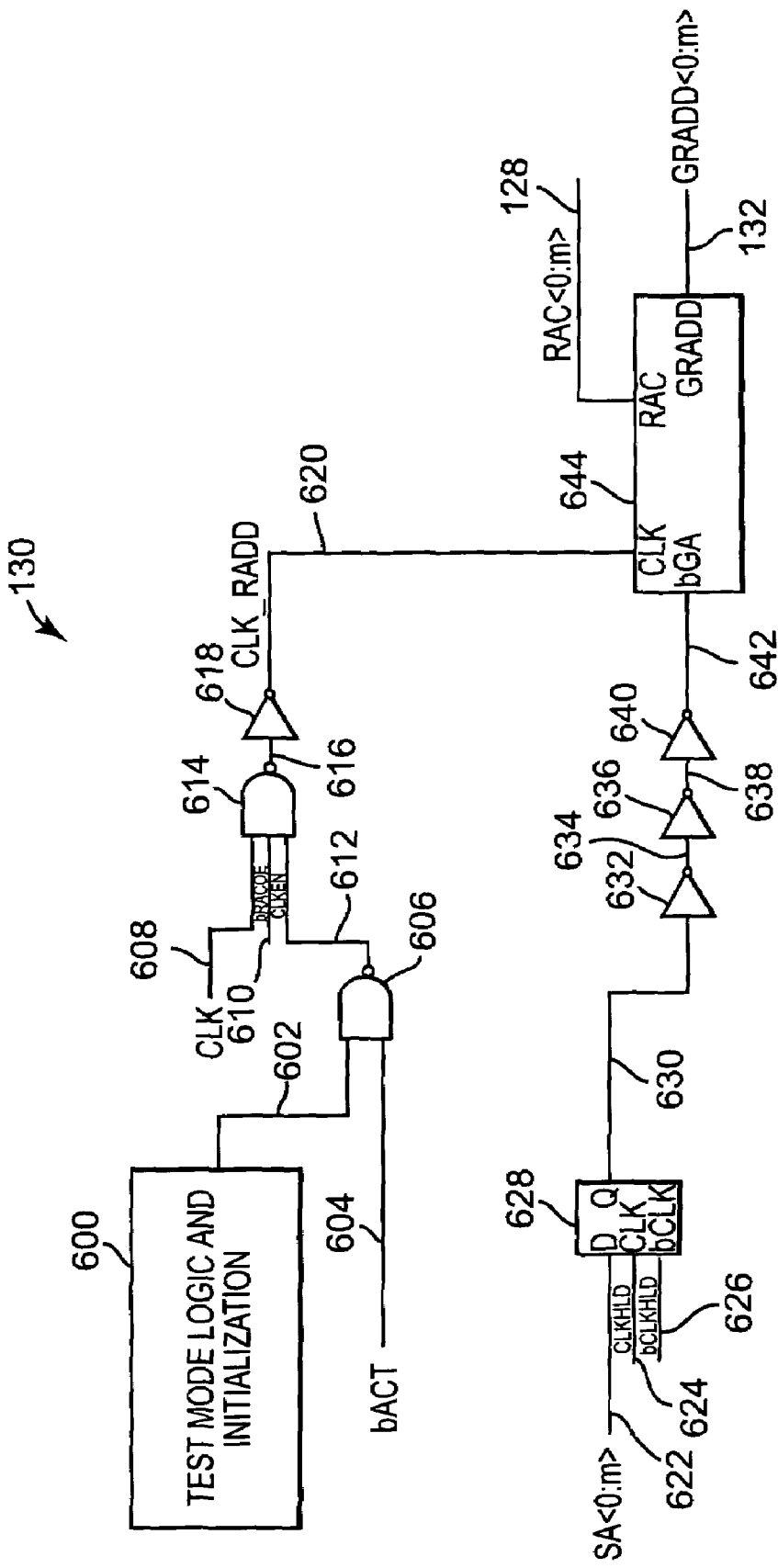
FIG. 8 is a diagram illustrating one embodiment of a two stage row address latch.

FIG. 8 is a diagram illustrating one embodiment of two stage row address latch 130. Two stage row address latch 130 includes test mode logic and initialization circuit 600, latches 628 and 644, NAND gates 606 and 614, and inverters 618, 632, 636, and 640. The output of test mode logic and initialization circuit 600 is electrically coupled to a first input of NAND gate 606 through signal path 602. A second input of NAND gate 606 receives the inverted activate (bACT) signal on bACT signal path 604. The output of NAND gate 606 is electrically coupled to a first input of NAND gate 614 through clock enable (CLKEN) signal path 612. A second input of NAND gate 614 receives a clock (CLK) signal on CLK signal path 608. A third input of NAND gate 614 receives the inverted row address counter output enable (bRACOE) signal on bRACOE signal path 610. The output of NAND gate 614 is electrically coupled to the input of inverter 618 through signal path 616. The output of inverter 618 is electrically coupled to the clock (CLK) input of latch 644 through clock row address (CLK_RADD) signal path 620.

The D input of latch 628 receives the row address for a read or write operation (SA<0:m>) signals on SA<0:m> communication path 622. The clock (CLK) input of latch 628 receives the clock hold (CLKHLD) signal on CLKHLD signal path 624. The inverted clock (bCLK) input of latch 628 receives the inverted clock hold (bCLKHLD) signal on bCLKHLD signal path 626. The Q output of latch 628 is electrically coupled to the input of inverter 632 through communication path 630. The output of inverter 632 is electrically coupled to the input of inverter 636 through communication path 634. The output of inverter 636 is electrically coupled to the input of inverter 640 through communication path 638. The output of inverter 640 is electrically coupled to the inverted row address for a read or write operation (bGA) input of latch 644 through communication path 642. The RAC input of latch 644 receives the RAC<0:m> signals on RAC<0:m> communication path 128. The GRADD output of latch 644 provides the GRADD<0:m> signals on GRADD<0:m> communication path 132.

Test mode logic and initialization circuit 600 outputs a logic low signal on signal path 602 with memory 106 not ready for operation. Test mode logic and initialization circuit 600 outputs a logic high signal on signal path 602 with memory 106 ready for operation. The bACT signal is logic low if a memory bank 112a-112(n) is being activated for read or write access and logic high if a memory bank 112a-112(n) is not being activated for read or write access. The bRACOE signal is logic low with the output of row address counter 166 enabled and logic high with the output of row address counter 166 disabled. The CLKHLD signal and the bCLKHLD signal are signals used to latch commands.

In response to a logic high signal on signal path 602 and a logic high bACT signal on bACT signal path 604, NAND gate 606 outputs a logic low CLKEN signal on CLKEN signal path 612. In response to a logic low signal on signal path 602 or a logic low bACT signal on bACT signal path 604, NAND gate 606 outputs a logic high CLKEN signal on CLKEN signal path 612.

In response to a logic high CLK signal on CLK signal path 608, a logic high bRACOE signal on bRACOE signal path 610, and a logic high CLKEN signal on CLKEN signal path 612, NAND gate 614 outputs a logic low signal on signal path 616. In response to a logic low CLK signal on CLK signal path 608, a logic low bRACOE signal on bRACOE signal path 610, or a logic low CLKEN signal on CLKEN signal path 612, NAND gate 614 outputs a logic high signal on signal path 616. Inverter 618 inverts the signal on signal path 616 to provide the CLK_RADD signal on CLK_RADD signal path 620.

Latch 628 receives the SA<0:m> signals on SA<0:m> communication path 622, the CLKHLD signal on CLKHLD signal path 624, and the bCLKHLD signal on bCLKHLD signal path 626 to provide the signals on communication path 630. In response to a logic low CLKHLD signal and a logic high bCLKHLD signal, latch 628 receives the SA<0:m> signals into the latch. In response to a logic high CLKHLD signal and a logic low bCLKHLD signal, latch 628 latches the SA<0:m> signals and passes the SA<0:m> signals to communication path 630.

Inverter 632 inverts the signals on communication path 630 to provide the signals on communication path 634. Inverter 636 inverts the signals on communication path 634 to provide the signals on communication path 638. Inverter 640 inverts the signals on communication path 638 to provide the signals on communication path 642.

Latch 644 receives the signals on communication path 642, the CLK_RADD signal on CLK_RADD signal path 620, and the RAC<0:m> signals on RAC<0:m> communication path 128 to provide the GRADD<0:m> signals on GRADD<0:m> communication path 132. In response to a logic low CLK_RADD signal, latch 644 receives the signals on communication path 642 into the latch and passes the RAC<0:m> signals to GRADD<0:m> communication path 132. In response to a logic high CLK_RADD signal, latch 644 latches the signals on communication path 642 and passes the passes the signals to GRADD<0:m> communication path 132.

In operation, the two-stage latching scheme is used to enable back-to-back directed auto-refresh and activate commands. The decoded DARF command enters refresh control circuit 122 and triggers a RACOE signal that is input to row address latch 130. The RACOE signal closes a gate to stop the row addresses for a read or write operation from driving onto the row address bus (GRADD<0:m>) and opens a gate from row address counter 166 to allow the refresh row address to drive onto the row address bus. The RACOE signal is long enough to flip latch 644. On the next activate command, the bRACOE signal is logic high. With a logic high CLKHOLD signal, the row addresses for a read or write operation are passed to the row address bus (GRADD<0:m>).

Figure 9A:
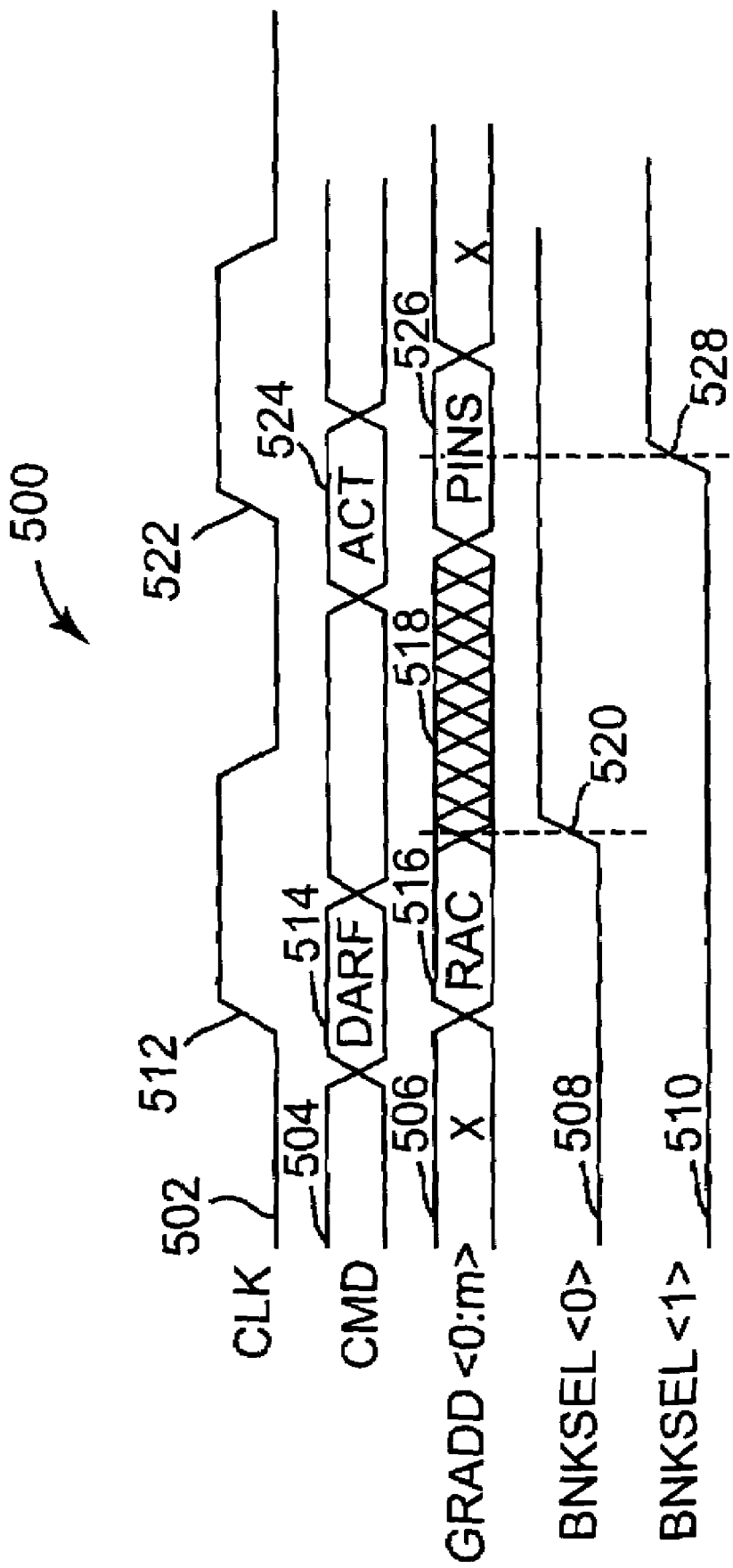
FIG. 9A is a timing diagram illustrating one embodiment of the timing of signals for back-to-back directed auto-refresh and activate commands.

FIG. 9A is a timing diagram 500 illustrating one embodiment of the timing of signals for back-to-back directed auto-refresh and activate commands. Timing diagram 500 includes clock (CLK) signal 502 on CLK signal path 608, command (CMD) signal 504, GRADD<0:m> signals 506 on GRADD<0:m> communication path 132, BNKSEL<0> signal 508 on BNKSEL<0:3> communication path 148, and BNKSEL<1> signal 510 on BNKSEL<0:3> communication path 148. To achieve a bandwidth improvement with DARF mode enabled, a DARF is performed on a first memory bank 112a-112(n) in response to a clock cycle and an activate command is performed on a second memory bank 112a-112(n) in response to the following clock cycle. This places a new timing constraint on the bank and row address busses. The data is valid for one cycle of the DARF and then is used in the next clock cycle for the activate command.

In response to rising edge 512 of CLK signal 502, a DARF mode command at 514 on CMD signal 504 is received. In response to the DARF mode command at 514, the row address counter addresses are provided on GRADD<0:m> signals 506 at 516. At 520, bank zero is selected. In response to rising edge 522 of CLK signal 502, an activate command is received at 524. In response to the activate command, the row addresses from the pins for the read or write operation are provided on GRADD<0:m> signals 506 at 526. The global row address is complete before BNKSEL<1> signal 510 transitions to logic high at 528. GRADD<0:m> signals 506 are valid long enough to be latched by row address latch 130 with BNKSEL<0> signal 508, but short enough that the next command is not affected.

Figure 9B:
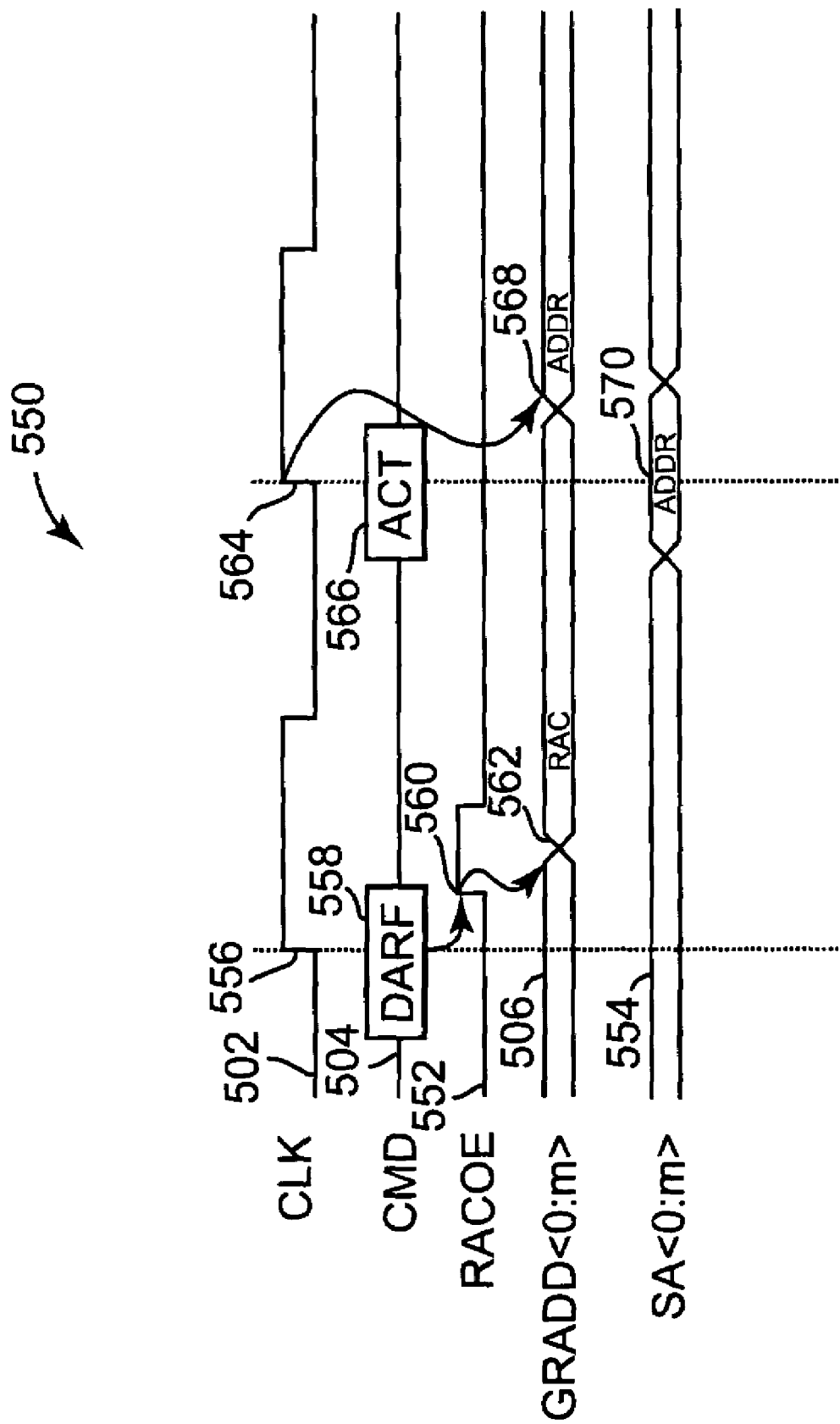
FIG. 9B is a timing diagram illustrating another embodiment of the timing of signals for back-to-back directed auto-refresh and activate commands.

FIG. 9B is a timing diagram 550 illustrating another embodiment of the timing of signals for back-to-back directed auto-refresh and activate commands. Timing diagram 550 includes CLK signal 502 on CLK signal path 608, CMD signal 504, row address counter output enable (RACOE) signal 552, GRADD<0:m> signals 506 on GRADD<0:m> communication path 132, and SA<0:m> signals 554 on SA<0:m> communication path 622. In response to rising edge 556 of CLK signal 502, a DARF command is received at 558 on CMD signal 504. In response to the DARF command, RACOE signal 552 transitions to logic high at 560. In response to the rising edge 560 of RACOE signal 552, the row address counter address is provided on GRADD<0:m> signals 506 at 562. In response to rising edge 564 of CLK signal 502, an activate command is received at 566 on CMD signal 504. In response to the activate command, the address on SA<0:m> signals 554 at 570 are provided on GRADD<0:m> signals 506 at 568.

Figure 10:
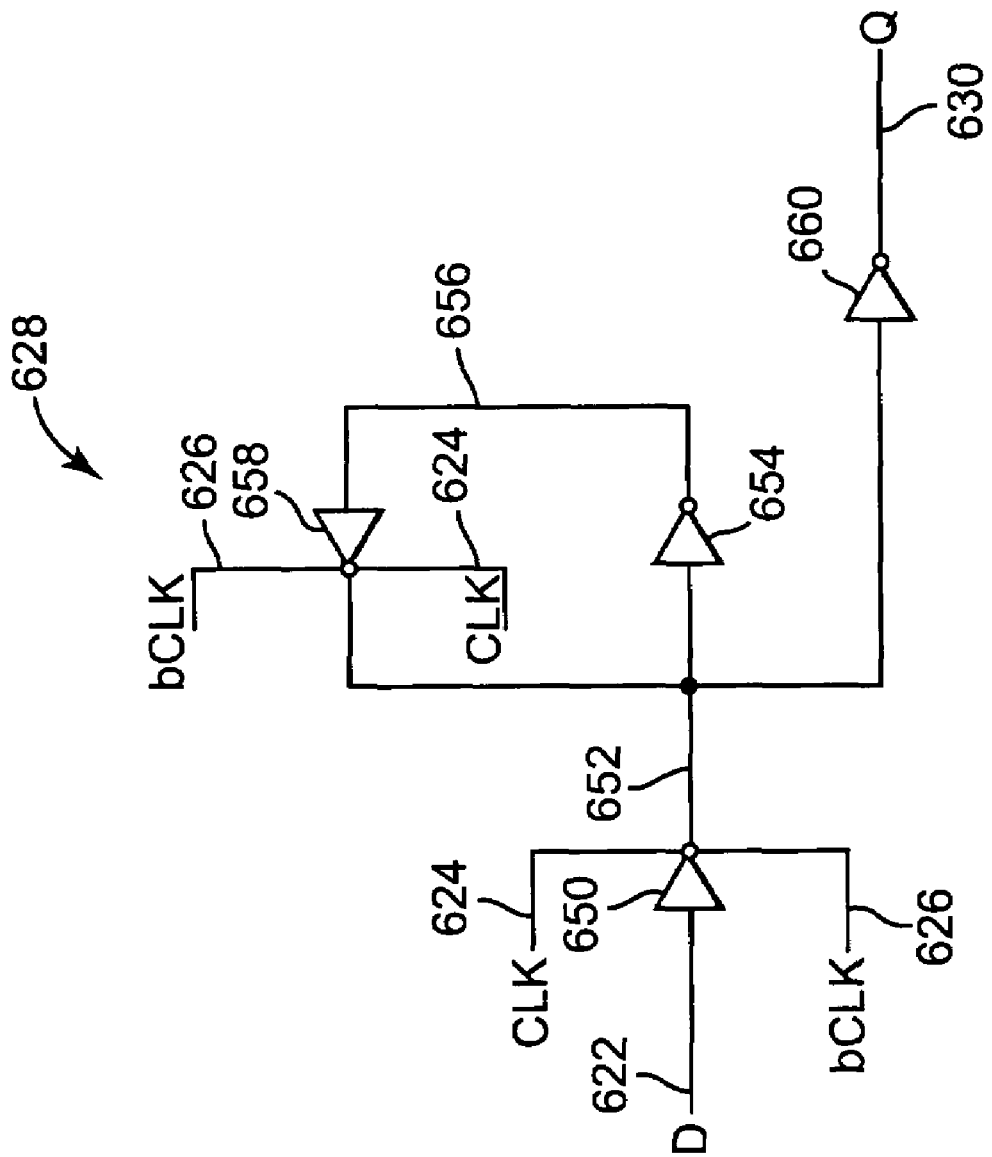
FIG. 10 is a diagram illustrating one embodiment of the first latch stage of the row address latch.

FIG. 10 is a diagram illustrating one embodiment of first latch stage 628 of row address latch 130. First latch stage 628 includes tri-state inverters 650 and 658 and inverters 654 and 660. The data input of tri-state inverter 650 receives the SA<0:m> signals on input D communication path 622. The logic low enable input of tri-state inverter 650 receives the CLKHLD signal on CLK input signal path 624. The logic high enable input of tri-state inverter 650 receives the bCLKHLD signal on bCLK input signal path 626. The data output of tri-state inverter 650 is electrically coupled to the data output of tri-state inverter 658, the input of inverter 654, and the input of inverter 660 through communication path 652.

The output of inverter 654 is electrically coupled to the data input of tri-state inverter 658 through communication path 656. The logic low enable input of tri-state inverter 658 receives the bCLKHLD signal on bCLK input signal path 626. The logic high enable input of tri-state inverter 658 receives the CLKHLD signal on CLK input signal path 624. The output of inverter 660 provides the signals on output Q communication path 630.

In response to a logic low CLKHLD signal on CLK input signal path 624 and a logic high bCLKHLD signal on bCLK input signal path 626, tri-state inverter 650 is turned on to pass and invert the SA<0:m> signals on input D communication path 622 to provide the signals on communication path 652. In response to a logic high CLKHLD signal on CLK input signal path 624 and a logic low bCLKHLD signal on bCLK input signal path 626, tri-state inverter 650 is turned off to block the SA<0:m> signals on input D communication path 622 from being inverted and passed to communication path 652. With tri-state inverter 650 turned off, the output of tri-state inverter 650 is high impedance. Inverter 654 inverts the signals on communication path 652 to provide the signals on communication path 656. Inverter 660 inverts the signals on communication path 652 to provide the signals on output Q communication path 630.

In response to a logic high CLKHLD signal on CLK input signal path 624 and a logic low bCLKHLD signal on bCLK input signal path 626, tri-state inverter 658 is turned on to pass and invert the signals on communication path 656 to provide the signals on communication path 652. In response to a logic low CLKHLD signal on CLK input signal path 624 and a logic high bCLKHLD signal on bCLK input signal path 626, tri-state inverter 658 is turned off to block the signals on communication path 656 from being inverted and passed to communication path 652. With tri-state inverter 658 turned off, the output of tri-state inverter 658 is high impedance. Tri-state inverter 658 and inverter 654 provide a latch for latching the SA<0:m> signals on input D communication path 622.

In operation, in response to a logic low CLKHLD signal and a logic high bCLKHLD signal, the SA<0:m> signals pass to the latch provided by inverter 654 and tri-state inverter 658. In response to a logic high CLKHLD signal and a logic low bCLKHLD signal, the SA<0:m> signals are latched by inverter 654 and tri-state inverter 658 to provide the SA<0:m> signals on output Q communication path 630.

Figure 11:
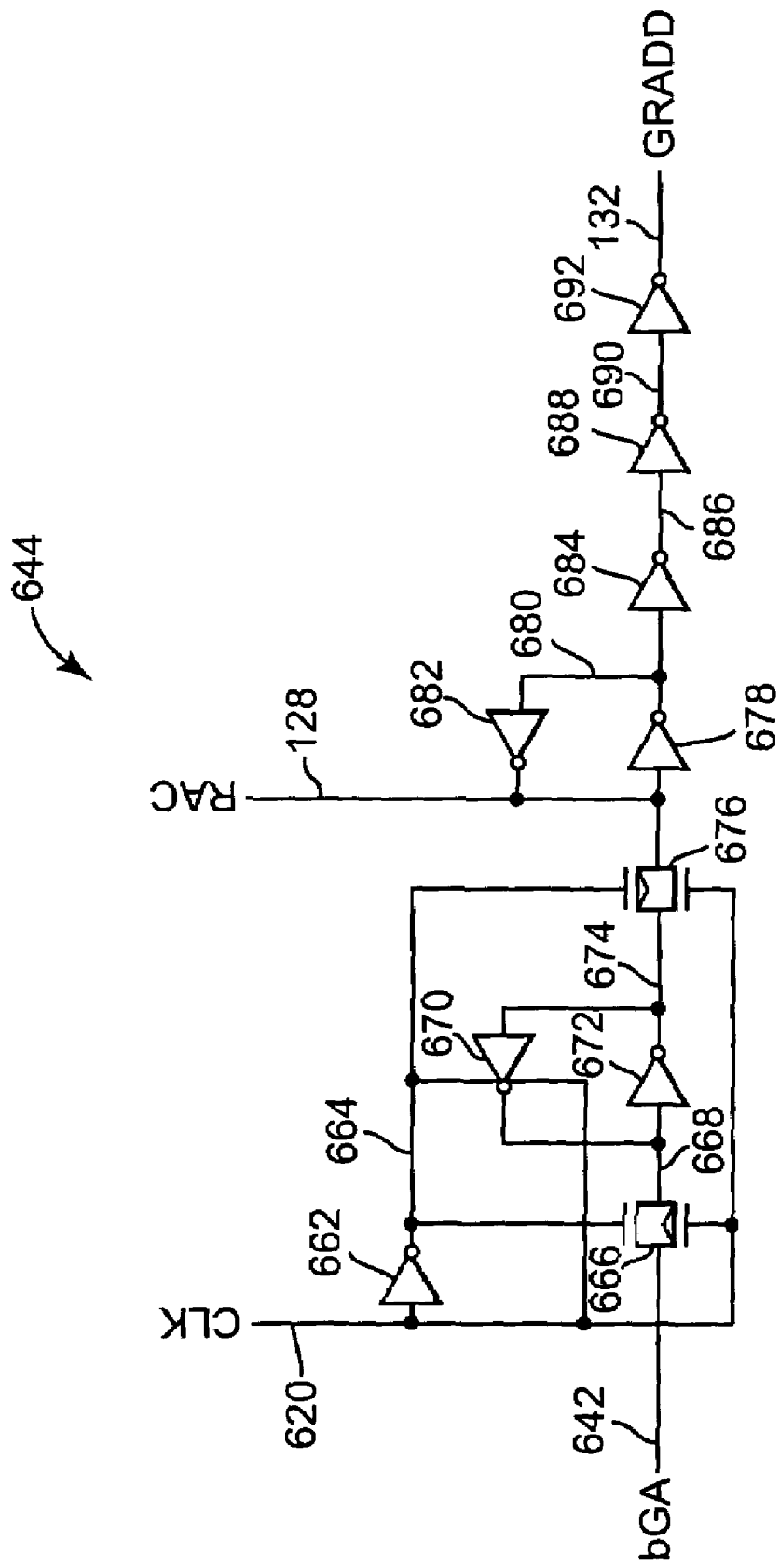
FIG. 11 is a diagram illustrating one embodiment of the second latch stage of the row address latch.

FIG. 11 is a diagram illustrating one embodiment of second latch stage 644 of row address latch 130. Second latch stage 644 includes inverters 662, 672, 678, 682, 684, 688, and 692, tri-state inverter 670, and transmission gates 666 and 676. The input of inverter 662, the logic high enable input of tri-state inverter 670, the logic low enable input of transmission gate 666, and the logic high enable input of transmission gate 676 receive the CLK_RADD signal on CLK input signal path 620. The output of inverter 662 is electrically coupled to the logic high enable input of transmission gate 666, the logic low enable input of tri-state inverter 670, and the logic low enable input of transmission gate 676.

The data input of transmission gate 666 receives the signal on bGA input communication path 642. The data output of transmission gate 666 is electrically coupled to the input of inverter 672 and the output of tri-state inverter 670 through communication path 668. The output of inverter 672 is electrically coupled to the data input of transmission gate 676 and the data input of tri-state inverter 670 through communication path 674. The data output of transmission gate 676 is electrically coupled to the output of inverter 682 and the input of inverter 678 through RAC input communication path 128. The output of inverter 678 is electrically coupled to the input of inverter 682 and the input of inverter 684 through communication path 680. The output of inverter 684 is electrically coupled to the input of inverter 688 through communication path 686. The output of inverter 688 is electrically coupled to the input of inverter 692 through communication path 690. The output of inverter 692 provides the GRADD<0:m> signals on GRADD output communication path 132.

Inverter 662 inverts the CLK_RADD signal on CLK input signal path 620 to provide the signal on signal path 664. In response to a logic low CLK_RADD signal on CLK input signal path 620 and a logic high signal on signal path 664, transmission gate 666 is turned on to pass the signals on bGA input communication path 642 to communication path 668. In response to a logic high CLK_RADD signal on CLK input signal path 620 and a logic low signal on signal path 664, transmission gate 666 is turned off to block the signals on bGA input communication path 642 from passing to communication path 668.

Inverter 672 inverts the signals on communication path 668 to provide the signals on communication path 674. In response to a logic high CLK_RADD signal on CLK input signal path 620 and a logic low signal on signal path 664, tri-state inverter 670 is turned on to pass and invert the signals on communication path 674 to provide the signals on communication path 668. In response to a logic low CLK_RADD signal on CLK input signal path 620 and a logic high signal on signal path 664, tri-state inverter 670 is turned off to block the signals on communication path 674 from being inverted and passed to communication path 668. With tri-state inverter 670 turned off, the output of tri-state inverter 670 is high impedance. Tri-state inverter 670 and inverter 672 provide a latch.

In response to a logic high CLK_RADD signal on CLK input signal path 620 and a logic low signal on signal path 664, transmission gate 676 is turned on to pass the signals on communication path 674 to RAC input communication path 128. In response to a logic low CLK_RADD signal on CLK input signal path 620 and a logic high signal on signal path 664, transmission gate 676 is turned off to block the signals on communication path 674 from passing to RAC input communication path 128.

Inverter 678 inverts the signals on RAC input communication path 128 to provide the signals on communication path 680. Inverter 682 inverts the signals on communication path 680 to provide the signals on RAC input communication path 128. Inverters 678 and 682 provide a latch. Inverter 184 inverts the signals on communication path 680 to provide the signals on communication path 686. Inverter 688 inverts the signals on communication path 686 to provide the signals on communication path 690. Inverter 692 inverts the signals on communication path 690 to provide the GRADD<0:m> signals on GRADD output communication path 132.

In operation, in response to a logic low CLK_RADD signal, the signals on bGA input communication path 642 are passed to the latch provided by inverter 672 and tri-state inverter 670. In response to a logic high CLK_RADD signal, the signals on bGA input communication path 642 are latched by inverter 672 and tri-state inverter 670 and passed to the latch provided by inverters 678 and 682 with the RACOE signal logic low. The latch provided by inverters 678 and 682 latches the RAC<0:m> signals on RAC input communication path 128 with the RACOE signal logic high. The output GRADD<0:m> signals are the RAC<0:m> signals if the CLK_RADD signal is logic low and the SA<0:m> signals if the CLK_RADD signal is logic high.

Figure 12:
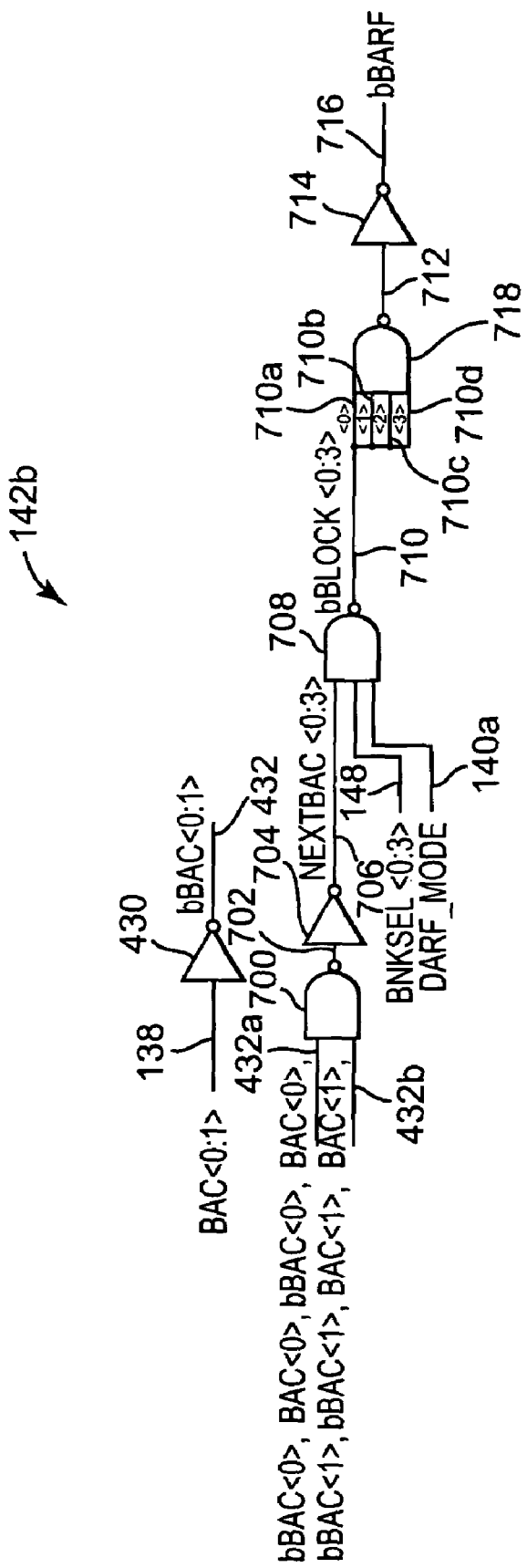
FIG. 12 is a diagram illustrating one embodiment of a circuit for bypassing a memory bank.

FIG. 12 is a diagram illustrating one embodiment of a circuit 142b for bypassing a memory bank 112a-112(n). In this embodiment, n equals 3. In one embodiment, circuit 142b is part of DARF bank selection circuit 142. Circuit 142b includes inverters 430, 704, and 714 and NAND gates 700, 708, and 718. Inverter 430 receives the BAC<0:1> signals on BAC<0:1> communication path 138 to provide the bBAC<0:1> signals on bBAC<0:1> communication path 432. A first input of NAND gate 700 receives the bBAC<0>, BAC<0>, bBAC<0>, and BAC<0> signals through communication path 432a. A second input of NAND gate 700 receives the bBAC<1>, bBAC<1>, BAC<1>, and BAC<1> signals through communication path 432b. The output of NAND gate 700 is electrically coupled to the input of inverter 704 through communication path 702.

The output of inverter 704 is electrically coupled to a first input of NAND gate 708 through next bank address counter (NEXTBAC<0:3>) communication path 706. A second input of NAND gate 708 receives the BNKSEL<0:3> signals on BANKSEL<0:3> communication path 148. A third input of NAND gate 708 receives the DARF_MODE signal on DARF_MODE signal path 140a. The output of NAND gate 708 is electrically coupled to the inputs of NAND gate 718 through inverted block (bBLOCK<0:3>) communication path 710. A first input of NAND gate 718 is electrically coupled to bBLOCK<0> communication path 710a, a second input of NAND gate 718 is electrically coupled to bBLOCK<1> signal path 710b, a third input of NAND gate 718 is electrically coupled to bBLOCK<2> signal path 710c, and a fourth input of NAND gate 718 is electrically coupled to bBLOCK<3> signal path 710d. The output of NAND gate 718 is electrically coupled to the input of inverter 714 through signal path 712. The output of inverter 714 provides the inverted bypass auto-refresh (bBARF) signal on bBARF signal path 716.

Inverter 430 inverts the BAC<0:1> signals on BAC<0:1>communication path 138 to provide the bBAC<0:1> signals on bBAC<0:1> communication path 432. In response to a logic high signal on communication path 432a and a corresponding logic high signal on communication path 432b, NAND gate 700 outputs a corresponding logic low signal on communication path 702. In response to a logic low signal on communication path 432a or a corresponding logic low signal on communication path 432b, NAND gate 700 outputs a corresponding logic high signal on communication path 702. Inverter 704 inverts the signals on communication path 702 to provide the NEXTBAC<0:3> signals on NEXTBAC<0:3> communication path 706.

In response to a logic high NEXTBAC<0:3> signal on NEXTBAC<0:3>communication path 706, a corresponding logic high BNKSEL<0:3> signal on BNKSEL<0:3> communication path 148, and a logic high DARF_MODE signal on DARF_MODE signal path 140a, NAND gate 708 outputs a corresponding logic low bBLOCK<0:3> signal on bBLOCK<0:3> communication path 710. In response to a logic low NEXTBAC<0:3> signal on NEXTBAC<0:3> communication path 706, a corresponding logic low BNKSEL<0:3> signal on BNKSEL<0:3> communication path 148, or a logic low DARF_MODE signal on DARF_MODE signal path 140a, NAND gate 708 outputs a corresponding logic high signal on bBLOCK<0:3> communication path 710.

In response to a logic high bBLOCK<0> signal on bBLOCK<0> signal path 710a, a logic high bBLOCK<1> signal on bBLOCK<1> signal path 710b, a logic high bBLOCK<2> signal on bBLOCK<2> signal path 710c, and a logic high bBLOCK<3> signal on bBLOCK<3> signal path 710d, NAND gate 718 outputs a logic low signal on signal path 712. In response to a logic low bBLOCK<0> signal on bBLOCK<0> signal 710a, a logic low bBLOCK<1> signal on bBLOCK<1> signal path 710b, a logic low bBLOCK<2> signal on bBLOCK<2> signal path 710c, or a logic low bBLOCK<3> signal on bBLOCK<3> signal path 710d, NAND gate 718 outputs a logic high signal on signal path 712. Inverter 714 inverts the signal on signal path 712 to provide the bBARF signal on bBARF signal path 716.

In operation, when a memory bank 112a-112(n) is active and BAC 136 is set to increment to that active memory bank 112a-112(n) on the next auto-refresh command, the bBARF signal is logic low to block the auto-refresh command. When a memory bank 112a-112(n) is not active and the BAC 136 is set to increment to that non-active memory bank 112a-112(n) on the next auto-refresh command, the bBARF signal is logic high to allow the auto-refresh command.

Figure 13:
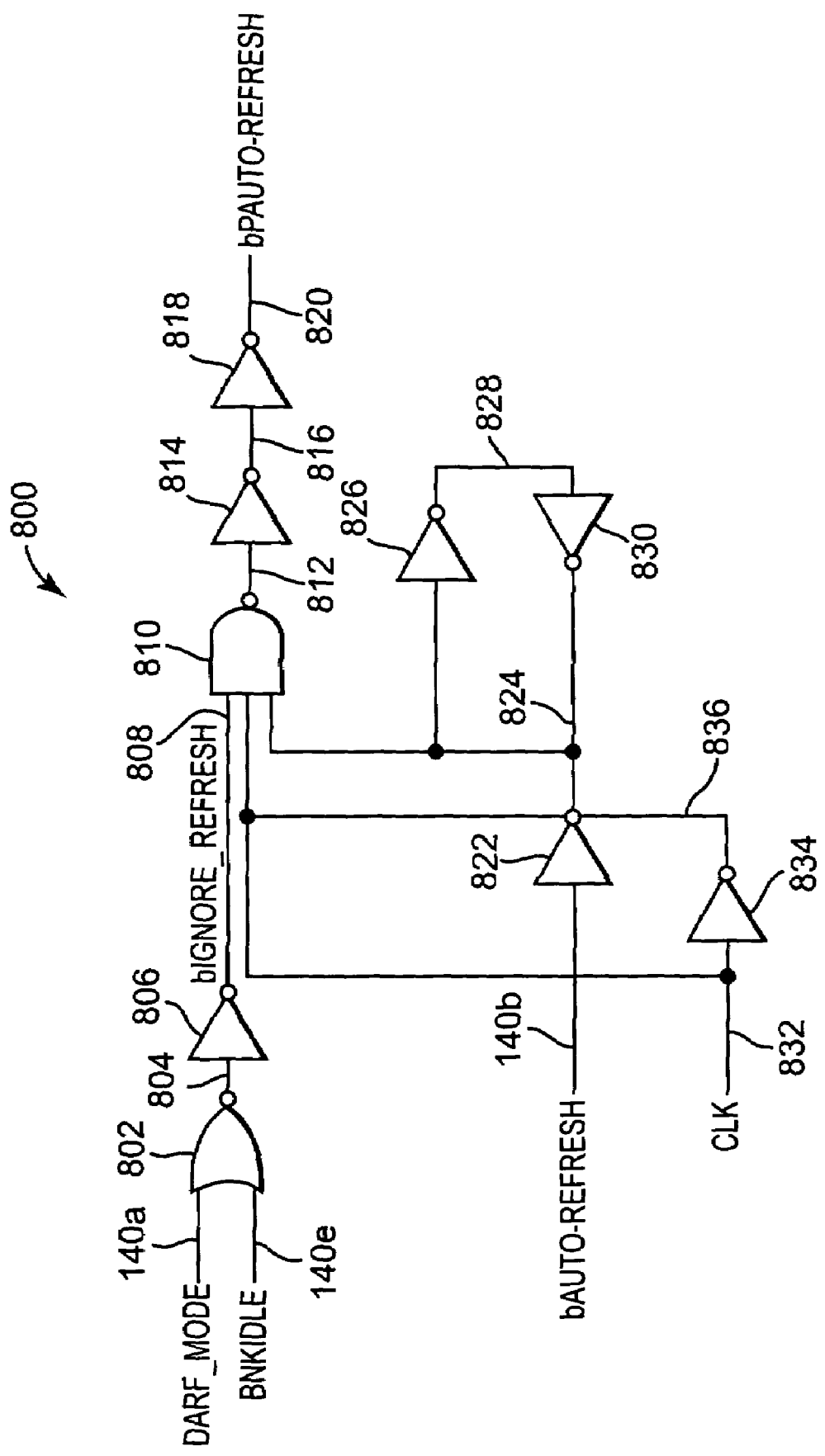
FIG. 13 is a diagram illustrating one embodiment of a circuit for allowing a directed auto-refresh while another memory bank is active.

FIG. 13 is a diagram illustrating one embodiment of a circuit 800 for allowing a directed auto-refresh while another memory bank 112a-112(n) is active. Circuit 800 includes NOR gate 802, inverters 806, 814, 818, 826, 830, and 834, NAND gate 810, and tri-state inverter 822. A first input of NOR gate 802 receives the DARF_MODE signal on DARF_MODE signal path 140a. A second input of NOR gate 802 receives the BNKIDLE signal on BNKIDLE signal path 140e. The output of NOR gate 802 is electrically coupled to the input of inverter 806 through signal path 804.

The output of inverter 806 is electrically coupled to a first input of NAND gate 810 through inverted ignore refresh (bIGNORE_REFRESH) signal path 808. A second input of NAND gate 810, the input of inverter 834, and the logic low enable input of tri-state inverter 822 receive the CLK signal on CLK signal path 832. The output of inverter 834 is electrically coupled to the logic high enable input of tri-state inverter 822 through signal path 836. The data input of tri-state inverter 822 receives the bAUTO-REFRESH signal on bAUTO_REFRESH signal path 140b. The data output of tri-state inverter 822 is electrically coupled to a third input of NAND gate 810, the input of inverter 826, and the output of inverter 830 through signal path 824. The output of inverter 826 is electrically coupled to the input of inverter 830 through signal path 828. The output of NAND gate 810 is electrically coupled to the input of inverter 814 through signal path 812. The output of inverter 814 is electrically coupled to the input of inverter 818 through signal path 816. The output of inverter 818 provides the bPAUTO-REFRESH signal on bPAUTO-REFRESH signal path 820.

In response to a logic low DARF_MODE signal on DARF_MODE signal path 140a and a logic low BNKIDLE signal on BNKIDLE signal path 140e, NOR gate 802 outputs a logic high signal on signal path 804. In response to a logic high DARF_MODE signal on DARF_MODE signal path 140a or a logic high BNKIDLE signal on BNKIDLE signal path 140e, NOR gate 802 outputs a logic low signal on signal path 804. Inverter 806 inverts the signal on signal path 804 to provide the bIGNORE_REFRESH signal on bIGNORE_REFRESH signal path 808.

Inverter 834 inverts the CLK signal on CLK signal path 832 to provide the signal on signal path 836. In response to a logic low CLK signal on CLK signal path 832 and a logic high signal on signal path 836, tri-state inverter 822 is turned on to pass and invert the bAUTO_REFRESH signal on bAUTO_REFRESH signal path 140b to provide the signal on signal path 824. In response to a logic high CLK signal on CLK signal path 832 and a logic low signal on signal path 836, tri-state inverter 822 is turned off to block the bAUTO-REFRESH signal on bAUTO_REFRESH signal path 140b from being inverted and passed to signal path 824. With tri-state inverter 822 turned off, the output of tri-state inverter 822 is high impedance.

Inverter 826 inverts the signal on signal path 824 to provide the signal on signal path 828. Inverter 830 inverts the signal on signal path 828 to provide the signal on signal path 824. Inverters 826 and 830 provide a latch to latch the bAUTO-REFRESH signal when tri-state inverter 822 is turned off. In response to a logic high bIGNORE_REFRESH signal on bIGNORE_REFRESH signal path 808, a logic high CLK signal on CLK signal path 832, and a logic high signal on signal path 824, NAND gate 810 outputs a logic low signal on signal path 812. In response to a logic low bIGNORE_RE- FRESH signal on bIGNORE_REFRESH signal path 808, a logic low CLK signal on CLK signal path 832, or a logic low signal on signal path 824, NAND gate 810 outputs a logic high signal on signal path 812. Inverter 814 inverts the signal on signal path 812 to provide the signal on signal path 816. Inverter 818 inverts the signal on signal path 816 to provide the bPAUTO-REFRESH signal on bPAUTO-REFRESH signal path 820.

In typical DRAM operation, it is an illegal operation to issue an auto-refresh command while any memory bank 112a-112(n) is active. If such a command sequence would be performed, the auto-refresh would be blocked. In DARF mode, however, an auto-refresh command is allowed with a memory bank 112a-112(n) active. Auto-refreshing a memory bank 112a-112(n) in DARF mode is allowed while another memory bank 112a-112(n) is active for read or write operations. With DARF mode enabled, circuit 800 prevents the blocking of an auto-refresh command with a memory bank 112a-112(n) active by providing the bPAUTO-REFRESH signal based on the bIGNORE_REFRESH signal.

If the DARF_MODE signal is logic high or the BNKIDLE signal is logic high, the bIGNORE_REFRESH signal is logic high. If the DARF_MODE signal is logic low and the BNKIDLE signal is logic low, the bIGNORE_REFRESH signal is logic low. With a logic high bIGNORE_REFRESH signal, a logic high clock signal, and a logic high inverted bAUTO-REFRESH signal latched by inverters 826 and 830, the bPAUTO-REFRESH signal is logic low. With a logic low bIGNORE_REFRESH signal, a logic low clock signal, or a logic low inverted bAUTO-REFRESH signal latched by inverters 826 and 830, the bPAUTO-REFRESH signal is logic high.

Figure 14:
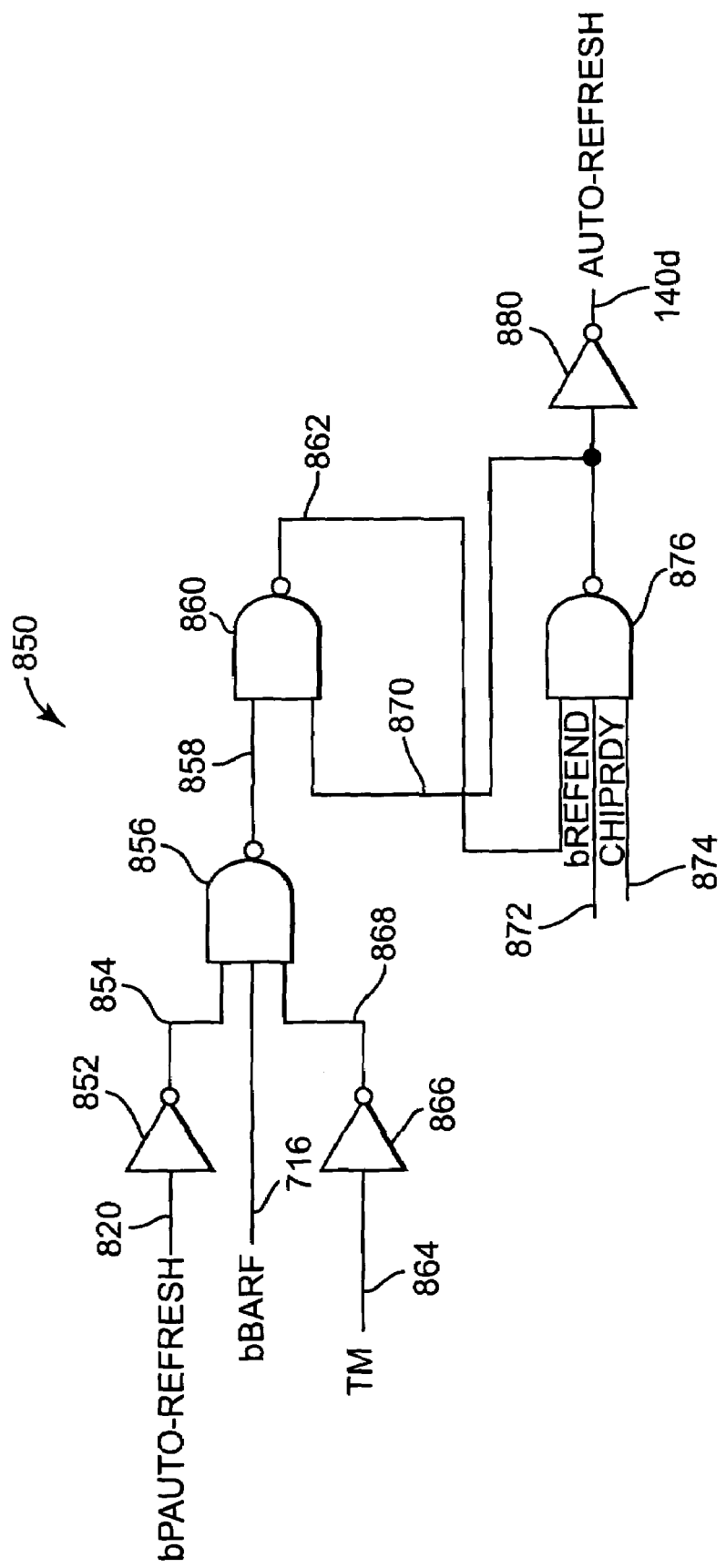
FIG. 14 is a diagram illustrating one embodiment of a circuit for providing an auto-refresh signal.

FIG. 14 is a diagram illustrating one embodiment of a circuit 850 for providing an auto-refresh signal. Circuit 850 includes inverters 852, 866, and 880 and NAND gates 856, 860, and 876. The input of inverter 852 receives the bPAUTO-REFRESH signal on bPAUTO-REFRESH signal path 820. The output of inverter 852 is electrically coupled to a first input of NAND gate 856 through signal path 854. A second input of NAND gate 856 receives the bBARF signal on bBARF signal path 716. The input of inverter 866 receives the test mode (TM) signal on TM signal path 864. The output of inverter 866 is electrically coupled to a third input of NAND gate 856 through signal path 868.

The output of NAND gate 856 is electrically coupled to a first input of NAND gate 860 through signal path 858. The output of NAND gate 860 is electrically coupled to a first input of NAND gate 876 through signal path 862. A second input of NAND gate 876 receives the inverted refresh end (bREFEND) signal on bREFEND signal path 872. A third input of NAND gate 876 receives the chip ready (CHIPRDY) signal on CHIPRDY signal path 874. The output of NAND gate 876 is electrically coupled to a second input of NAND gate 860 and the input of inverter 880 through signal path 870. The output of inverter 880 provides the AUTO-REFRESH signal on AUTO-REFRESH signal path 140d.

The TM signal is logic high if a test mode for memory 106 is enabled and logic low if a test mode for memory 106 is disabled. The bREFEND signal is logic high at the completion of a refresh and logic low during a refresh. The CHIPRDY signal is logic high if memory chip 106 is ready for operation and logic low if memory chip 106 is not ready for operation.

Inverter 852 inverts the bPAUTO-REFRESH signal on bPAUTO-REFRESH signal path 820 to provide the signal on signal path 854. Inverter 866 inverts the TM signal on TM signal path 864 to provide the signal on signal path 868. In response to a logic high signal on signal path 854, a logic high bBARF signal on bBARF signal path 716, and a logic high signal on signal path 868, NAND gate 856 outputs a logic low signal on signal path 858. In response to a logic low signal on signal path 854, a logic low bBARF signal on bBARF signal path 716, or a logic low signal on signal path 868, NAND gate 856 outputs a logic high signal on signal path 858.

In response to a logic high signal on signal path 858 and a logic high signal on signal path 870, NAND gate 860 outputs a logic low signal on signal path 862. In response to a logic low signal on signal path 858 or a logic low signal on signal path 870, NAND gate 860 outputs a logic high signal on signal path 862. In response to a logic high signal on signal path 862, a logic high bREFEND signal on bREFEND signal path 872, and a logic high CHIPRDY signal on CHIPRDY signal path 874, NAND gate 876 outputs a logic low signal on signal path 870. In response to a logic low signal on signal path 862, a logic low bREFEND signal on bREFEND signal path 872, or a logic low CHIPRDY signal on CHIPRDY signal path 874, NAND gate 876 outputs a logic high signal on signal path 870. NAND gates 860 and 876 provide a latch. Inverter 880 inverts the signal on signal path 870 to provide the AUTO-REFRESH signal on AUTO-REFRESH signal path 140d.

In operation, if the bPAUTO-REFRESH signal is logic low, the bBARF signal is logic high, the TM signal is logic low, the bREFEND signal is logic high, and the CHIPRDY signal is logic high, then the AUTO-REFRESH signal is logic high. If the bPAUTO-REFRESH signal is logic high, the bBARF signal is logic low, the TM signal is logic high, the bREFEND signal is logic low, or the CHIPRDY signal is logic low, then the AUTO-REFRESH signal is logic low.

Embodiments of the present invention provide a directed auto-refresh mode implementation for performing a directed auto-refresh of one memory bank while another memory bank is active for read and write access. By allowing a directed auto-refresh of one memory bank while another memory bank is active for access, the bandwidth of the memory is increased. With the directed auto-refresh mode enabled, high-speed back-to-back auto-refresh and activate commands can be performed.

What is claimed is:

1. A memory comprising:
   a row address latch comprising:
   a first stage configured to latch a first row address for a memory read or write operation; and
   a second stage configured to latch a second row address for a memory bank auto-refresh,
   wherein the row address latch provides the first row address from the first stage through the second stage in response to an activate command and provides the second row address from the second stage in response to a directed auto-refresh command.

2. The memory of claim 1, wherein the row address latch is configured for performing back-to-back directed auto-refresh and activate commands.

3. The memory of claim 1, wherein the row address latch provides the first row address from the first stage and the second row address from the second stage on a global row address bus.

4. The memory of claim 1, wherein the row address latch is configured to provide one of the first row address from the first stage and the second row address from the second stage to select a row of memory cells in a first memory bank, and to provide the other of the first row address from the first stage and the second row address from the second stage to select a row of memory cells in a second memory bank.

5. The memory of claim 1, further comprising:
a row address counter configured to provide the second row address for the memory bank auto-refresh.

6. A memory comprising:
at least two memory banks, each memory bank comprising an array of memory cells including rows and columns;
a row address counter configured to provide a first row address for selecting a row of memory cells for a directed auto-refresh; and
a row address latch having a first stage configured to latch a second row address for a read or write operation and a second stage configured to latch the first row address from the row address counter, the row address latch configured to provide one of the second row address from the first stage through the second stage and the first row address from the second stage based on a directed auto-refresh signal.

7. The memory of claim 6, wherein the row address latch is configured to provide one of the second row address from the first stage and the first row address from the second stage in response to a first clock signal, and provide the other of the second row address from the first stage and the first row address from the second stage in response to a second clock signal immediately following the first clock signal.

8. The memory of claim 6, wherein the row address latch provides the second row address from the first stage in response to an activate command and provides the first row address from the second stage in response to a directed auto-refresh command.

9. The memory of claim 6, wherein the row address latch provides the second row address from the first stage and the first row address from the second stage on a global row address bus.

10. The memory of claim 6, wherein the row address latch is configured to provide one of the second row address from the first stage and the first row address from the second stage to select a row of memory cells in a first of the at least two memory banks, and to provide the other of the second row address from the first stage and the first row address from the second stage to select a row of memory cells in a second of the at least two memory banks.

11. A method for refreshing a memory, the method comprising:
latching a first row address for accessing a first memory bank in a first latch stage of a row address latch;
latching a second row address for auto-refreshing a row of memory cells in a second memory bank in a second latch stage of the row address latch;
providing the first row address to the first memory bank in response to an activate command; and
providing the second row address to the second memory bank in response to a directed auto-refresh command,
wherein providing the first row address to the first memory bank comprises passing the first row address through the second latch stage.

12. The method of claim 11, further comprising:
auto-refreshing the row of memory cells in the second memory bank while accessing the first memory bank.

13. The method of claim 11, wherein providing the first row address comprises providing the first row address in response to a first clock signal, and wherein providing the second row address comprises providing the second row address in response to a second clock signal immediately following the first clock signal.

14. The method of claim 11, wherein providing the first row address comprises providing the first row address on a global row address bus, and wherein providing the second row address comprises providing the second row address on the global row address bus.

15. A method for operating a dynamic random access memory, the method comprising:
providing a first row address from a row address counter for auto-refreshing a row of memory cells in a first memory bank;
providing a second row address for accessing a second memory bank;
latching the second row address in a first latch stage of a row address latch;
latching the first row address in a second latch stage of the row address latch;
providing the first row address on a row address bus in response to a directed auto-refresh command and a first clock signal; and
providing the second row address on the row address bus in response to an activate command and a second clock signal,
wherein providing the second row address on the row address bus comprises passing the second row address through the second latch stage to provide the second row address on the row address bus.

16. The method of claim 15, wherein providing the second row address on the row address bus comprises providing the second row address on the row address bus in response to the second clock signal immediately following the first clock signal.

* * * * *